（12）United States Patent
Ichijoh et al.

(10) Patent No.: US 10,332,976 B2
(45) Date of Patent: Jun. 25, 2019

(54) NITRIDE SEMICONDUCTOR DEVICE

(71) Applicant: SHARP KABUSHIKI KAISHA, Sakai, Osaka (JP)

(72) Inventors: Hisao Ichijoh, Kanazawa (JP); Masaru Kubo, Sakai (JP); Masayuki Fukumi, Sakai (JP); Norihisa Fujii, Fukuyama (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/755,832

(22) PCT Filed: Mar. 30, 2016

(86) PCT No.: PCT/JP2016/060504
§ 371 (c)(1),
(2) Date: Feb. 27, 2018

(87) PCT Pub. No.: WO2017/038139
PCT Pub. Date: Mar. 9, 2017

(65) Prior Publication Data
US 2018/0331190 A1 Nov. 15, 2018

(30) Foreign Application Priority Data
Aug. 28, 2015 (JP) ................... 2015-169486

(51) Int. Cl.
*H01L 29/66* (2006.01)
*H01L 29/778* (2006.01)
(Continued)

(52) U.S. Cl.
CPC ............. *H01L 29/66462* (2013.01); *H01L 21/823456* (2013.01); *H01L 27/088* (2013.01);
(Continued)

(58) Field of Classification Search
CPC ......... H01L 29/66431; H01L 29/66439; H01L 29/66446; H01L 29/66462;
(Continued)

(56) References Cited

U.S. PATENT DOCUMENTS

2006/0043501 A1* 3/2006 Saito .................. H01L 29/0692
257/401
2007/0164326 A1 7/2007 Okamoto et al.
(Continued)

FOREIGN PATENT DOCUMENTS

JP H06-310955 A 11/1994
JP 2008-103705 A 5/2008
(Continued)

*Primary Examiner* — Eduardo A Rodela
(74) *Attorney, Agent, or Firm* — ScienBiziP, P.C.

(57) ABSTRACT

A nitride semiconductor device includes a second insulating film (22) covering at least a drain electrode (19) and a thermal stress reducer that reduces thermal stress in a place where thermal stress that is generated between the drain electrode (19) and the second insulating film (22) reaches its maximum at the time of a load short. The thermal stress reducer (19*bf*) is a drain field plate portion (19*bf*) formed by an extension of an upper part of the drain electrode (19) toward a source electrode (18).

14 Claims, 8 Drawing Sheets

(51) Int. Cl.

| | |
|---|---|
| *H01L 29/41* | (2006.01) |
| *H01L 29/78* | (2006.01) |
| *H01L 29/812* | (2006.01) |
| *H01L 29/06* | (2006.01) |
| *H01L 29/40* | (2006.01) |
| *H01L 29/417* | (2006.01) |
| *H01L 21/8234* | (2006.01) |
| *H01L 27/088* | (2006.01) |
| *H01L 23/00* | (2006.01) |

(52) U.S. Cl.
 CPC ............ *H01L 29/06* (2013.01); *H01L 29/402* (2013.01); *H01L 29/41* (2013.01); *H01L 29/41758* (2013.01); *H01L 29/66431* (2013.01); *H01L 29/778* (2013.01); *H01L 29/7786* (2013.01); *H01L 29/7787* (2013.01); *H01L 29/7789* (2013.01); *H01L 29/78* (2013.01); *H01L 29/812* (2013.01); *H01L 23/562* (2013.01)

(58) Field of Classification Search
 CPC ............ H01L 29/66469; H01L 29/778; H01L 29/7782; H01L 29/7784; H01L 29/7786; H01L 29/7789; H01L 2924/13064
 See application file for complete search history.

(56) References Cited

U.S. PATENT DOCUMENTS

| | | |
|---|---|---|
| 2008/0067546 A1 | 3/2008 | Murata et al. |
| 2010/0090250 A1 | 4/2010 | Murata et al. |
| 2014/0138704 A1* | 5/2014 | Tanaka .............. H01L 29/41725 257/76 |
| 2014/0264369 A1* | 9/2014 | Padmanabhan ..... H01L 29/7787 257/76 |
| 2015/0069407 A1 | 3/2015 | Matsubayashi et al. |
| 2015/0145004 A1 | 5/2015 | Inoue et al. |
| 2015/0155358 A1* | 6/2015 | Briere .................... H01L 9/405 257/76 |
| 2017/0345919 A1* | 11/2017 | Oyama ................ H01L 29/778 |

FOREIGN PATENT DOCUMENTS

| | | |
|---|---|---|
| JP | 2011-018841 A | 1/2011 |
| JP | 4888115 B2 | 2/2012 |
| JP | 2012-049170 A | 3/2012 |
| JP | 2013-229493 A | 11/2013 |
| JP | 2015-056437 A | 3/2015 |
| JP | 2015-103780 A | 6/2015 |
| JP | 2015-156454 A | 8/2015 |

* cited by examiner

NITRIDE SEMICONDUCTOR DEVICE

TECHNICAL FIELD

The present invention relates to nitride semiconductor devices and, in particular, to a nitride semiconductor device in which a source electrode, a drain electrode, and a gate electrode are formed over a nitride semiconductor layer.

BACKGROUND ART

An example of a conventional nitride semiconductor device is a group-III nitride semiconductor field-effect transistor having a heterostructure including a channel layer 1 and a barrier layer 2 as shown in FIG. 15 (Japanese Unexamined Patent Application Publication No. 2013-229493 (PTL 1)). This group-III nitride semiconductor field-effect transistor relates to a field-effect transistor having an insulating film 3 on a surface of a transistor element, and by depositing the insulating film 3 on a surface of the barrier layer 2, the value of a surface level is decreased and the effect of polarization on a hetero interface is increased, so that a nigh output can be attained by increasing a two-dimensional electron gas concentration.

It should be noted reference signs 4, 5, and 6 denote a source electrode, a gate electrode, and a drain electrode, respectively.

Further, another example of a conventional nitride semiconductor device is a field-effect transistor such as that shown in FIG. 16 (Japanese Patent No. 4888115 (PTL 2)). In this field-effect transistor, a drain field plate electrode 7*a* formed over a drain electrode 7 extends toward a field plate portion 9*a* of a gate electrode 9 along a surface of a SiON film 10 formed between the drain electrode 7 and the gate electrode 9.

This brings about improvement in withstand voltage by extending the drain field plate length and lessening an electric field at the drain end.

CITATION LIST

Patent Literature

PTL 1: Japanese Unexamined Patent Application Publication No. 2013-229493
PTL 2: Japanese Patent No. 4888115

SUMMARY OF INVENTION

Technical Problem

However, the conventional nitride semiconductor devices have the following problems.

That is, the group-III nitride semiconductor field-effect transistor disclosed in PTL 1 listed above has such a problem that in the case of the flow of a large current (i.e. a short circuit) in the presence of the application of a high voltage to the transistor element, the imposition of an energy of voltage multiplied by current causes the transistor element to generate heat so quickly that the element ends up deteriorating or breaking down.

For example, at the moment when, in a normally-on GaN HFET (heterojunction field-effect transistor), a large current of several amperes to several hundreds of amperes flows through the transistor element due to a short circuit between the source electrode and the drain electrode for some sort of reason in the presence of the application of 0V to the source electrode and the application of a high voltage (e.g. 400 V) to the drain electrode) in an off state where the application of −10 V to the gate electrode continues, the imposition of an energy of several kilowatts to several hundreds of kilowatts causes the element to generate heat so quickly that the element ends up breaking down.

In general, in an inverter circuit or the like, the transistor element may be brought into a short circuit condition by abnormal fluctuations in load and power source, depending on operating conditions. Even in such a case, the transistor element is required not to break down until the protective circuit works.

A Si device that is commonly used in a high-voltage (e.g. 400 V) and large-current application is a vertical device such as an IGBT (insulated-gate bipolar transistor). In this vertical device, the place of generation of maximum heat at the time of a load short is normally the drain region, which is high in electric field intensity, i.e. the bulk region.

On the other hand, the GaN HFET is a surface operating device that operates with a two-dimensional electron gas (hereinafter referred to as "2 DEG") as a carrier. As such, the GaN HFET has such characteristics as to be higher in power density per unit volume and higher in near-surface temperature than the Si device.

Furthermore, because of its superiority in material property, the GaN HFET can be made significantly lower in resistance than the Si device. This makes it possible to make the power density even higher along with a chip area reduction achieved by utilizing this characteristic. Further, in the case of use of a superlattice as an epitaxial structure for improvement in withstand voltage, the GaN HFET has such characteristics as to be low in vertical thermal conductivity, more likely to trap heat, and even higher in near-surface temperature.

As a result, the GaN device is higher in near-surface temperature than a Si device; therefore, a thermal stress difference between a wiring material (drain metal wire) and an insulating film such as a passivation film or an interlayer insulating film imposes a severe stress on the insulating film.

The inventors discovered that the breakdown of the GaN device at the time of a short circuit is attributed to a crack in the insulating film and elution of the drain metal wire that occur in a place (e.g. the front end of the drain metal wire) where thermal stress between the insulating film and the drain metal wire reaches its maximum. Moreover, the inventors clarified that a key to improvement in short-circuit withstand capacity is to reduce thermal stress in the place where thermal stress between the insulating film and the drain metal wire reaches its maximum.

Further, in the field-effect transistor disclosed in PTL 2 listed above, the withstand voltage is improved by lessening the electric field at the drain end with the drain field plate electrode 7*a*. In that case, a possible place where stress between an insulating film such as a passivation film or an interlayer insulating film to be formed over the drain field plate electrode 7*a* later and the drain field plate electrode 7*a* reaches its maximum at the time of a load short is a region A or B shown in FIG. 16. For the prevention of a crack in the insulating film in the region A or B at the time of a load short, it is necessary that thermal stress that is generated at the time of a load short in each region be smaller than the tensile strength of the insulating film in that region. However, PTL 2 listed above makes no mention of a configuration for reducing thermal stress that is generated at the time of a load short.

It is therefore an object of the present invention to provide a nitride semiconductor device with significant improvement in time from a short circuit to a breakdown (hereinafter referred to as "short-circuit withstand capacity (breakdown time)" by reducing thermal stress in a place where thermal stress between an insulating film and a drain metal wire reaches its maximum and thereby reducing thermal stress that is generated at the time of a short circuit.

Solution to Problem

In order to attain the object, a nitride semiconductor device of the present invention includes:

a nitride semiconductor layer having a heterostructure including at least a channel layer and a barrier layer;

a source electrode and a drain electrode, placed at a distance from each other, at least parts of which are formed over or within the nitride semiconductor layer;

a gate electrode formed between the source electrode and the drain electrode over the nitride semiconductor layer;

a first insulating film, formed between the source electrode and the gate electrode and between the gate electrode and the drain electrode over the nitride semiconductor layer;

a second insulating film covering at least the drain electrode; and a thermal stress reducer that reduces thermal stress in a place where thermal stress that is generated between the drain electrode and the second insulating film reaches its maximum at the time of a load short.

In the nitride semiconductor device, the thermal stress reducer is a drain field plate portion formed by an extension of an upper part of the drain electrode toward the source electrode.

Further, in a nitride semiconductor device according to an embodiment, the drain field plate portion has a length of 1 µm or longer, and a power density at the time of a load short in the presence of the application of a drain voltage of 400 V is 260 kW/cm$^2$ or lower.

Further, in a nitride semiconductor device according to an embodiment, the drain field plate portion has a length of 1 µm or longer, and a power density at the time of a load short in the presence of the application of a drain voltage of 400 V is 175 kW/cm$^2$ or lower.

Further, in a nitride semiconductor device according to an embodiment, the drain field plate portion has a length of 5 µm or longer, and a power density at the time of a load short in the presence of the application of a drain voltage of 400 V is 360 kW/cm$^2$ or lower.

Further, in a nitride semiconductor device according to an embodiment, the drain field plate portion has a length of 5 µm or longer, and a power density at the time of a load short in the presence of the application of a drain voltage of 400 V is 240 kW/cm$^2$ or lower.

Further, in a nitride semiconductor device according to an embodiment, the barrier layer has a thickness of 35 nm or thinner, and the gate electrode has a gate length of 5 µm or longer.

Further, in a nitride semiconductor device according to an embodiment, the barrier layer has a thickness of 25 nm or thinner, and the gate electrode has a gate length of 8.5 µm or longer.

Further, in a nitride semiconductor device according to an embodiment, the barrier layer has a thickness of 35 nm or thinner, and the gate electrode has a gate length of 2 µm or longer.

Further, in a nitride semiconductor device according to an embodiment, the barrier layer has a thickness of 25 nm or thinner, and the gate electrode has a gate length of 5 µm or longer.

Further, in a nitride semiconductor device according to an embodiment, the thermal stress reducer includes, in addition to the drain field plate portion, a layered structure in which each layer constituting the nitride semiconductor layer is of a single type of crystal lattice.

Further, in a nitride semiconductor device according to an embodiment, the drain field plate portion has a length of 1 µm or longer, and a power density at the time of a load short in the presence of the application of a drain voltage of 400 V is 330 kW/cm$^2$ or lower.

Further, in a nitride semiconductor device according to an embodiment, the drain field plate portion has a length of 1 µm or longer, and a power density at the time of a load short in the presence of the application of a drain voltage of 400 V is 220 kW/cm$^2$ or lower.

Further, in a nitride semiconductor device according to an embodiment, the drain field plate portion has a length of 5 µm or longer, and a power density at the time of a load short in the presence of the application of a drain voltage of 400 V is 450 kW/cm$^2$ or lower.

Further, in a nitride semiconductor device according to an embodiment, the drain field plate portion has a length of 5 µm or longer, and a power density at the time of a load short in the presence of the application of a drain voltage of 400 V is 300 kW/cm$^2$ or lower.

Further, in a nitride semiconductor device according to an embodiment, the drain electrode comprises a plurality of drain electrodes formed in finger shapes parallel to each other over the nitride semiconductor layer in a plan view, the source electrode comprises a plurality of source electrodes formed in finger shapes parallel to each other over the nitride semiconductor layer and arranged alternately with the drain electrodes in an arrangement direction of the drain electrodes, the gate electrode comprises a plurality of finger-shaped gate electrodes each formed over the nitride semiconductor layer and between that one of the drain electrodes and that one of the source electrodes which are disposed adjacent to each other, the plurality of drain electrodes, the plurality of source electrodes, and the plurality of gate electrodes are formed on the same chip, and a gate length of that one of the gate electrodes which is located in a central part of the chip is longer than a gate length of that one of the gate electrodes which is located in a peripheral part of the chip.

Advantageous Effects of Invention

As is clear from the above, a nitride semiconductor device of the present invention has, as a thermal stress reducer that reduces thermal stress in a place where thermal stress that is generated between the drain electrode and the second insulating film reaches its maximum, a drain field plate portion formed by an extension of an upper part of the drain electrode toward the source electrode. Therefore, the distance from directly below the front end of the drain field plate portion in the two-dimensional electron gas to the front end of the drain field plate portion is longer than in the absence of the drain field plate portion. This makes it possible to increase the transient thermal resistance.

This makes it possible to reduce the temperature of a place where thermal stress that is generated between the second insulating film and the drain electrode reaches its maximum, thus making it possible to reduce the thermal stress that is generated between the second insulating film and the drain electrode. This in turn makes it possible to prevent a crack in the second insulating film and elution of the drain electrode into the crack, thus making it possible to improve the short-circuit withstand capacity.

DESCRIPTION OF EMBODIMENTS

[Introduction]

Figure 4:
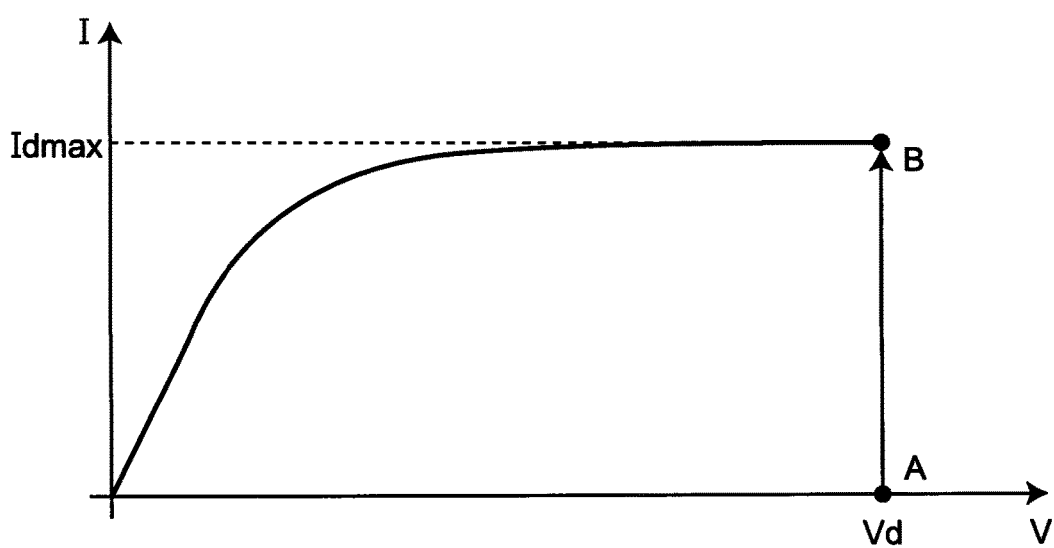
FIG. 4 is a diagram showing an I-V curve of a normally-on GaN HFET.

FIG. 4 is a schematic view of a typical I-V curve of a normally-on GaN HFET. In FIG. 4, Idmax represents a saturation current flowing through a drain electrode.

Figure 1:
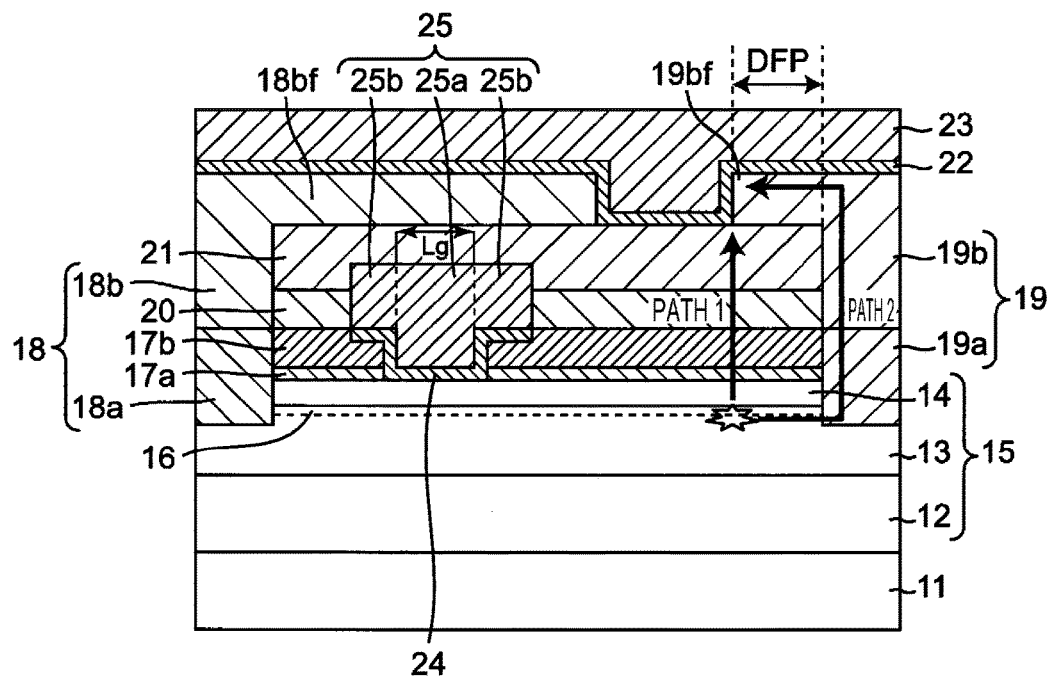
FIG. 1 is a cross-sectional view of a GaN HFET serving as a nitride semiconductor device of the present invention.

Note here that the saturation current Idmax refers to a current flowing through a drain electrode 19 of a GaN HFET of FIG. 1 according to the after-mentioned first embodiment in a case where a voltage Vg of 0 V is applied to a gate electrode 25, a voltage Vs of 0 V is applied to a source electrode 18, and a substrate potential is 0 V whereas a voltage Vd (of approximately 10 V or higher) is applied to the drain electrode 19.

As shown in FIG. 4, at the time of a load short, the operating point of the transistor shifts from the point A, where the transistor element is off, to the point B, where a large current flows while a high voltage is maintained. During the transition, the imposition of a power of voltage multiplied by current causes the transistor element to generate heat so quickly that the element ends up deteriorating or breaking down.

Figure 5:
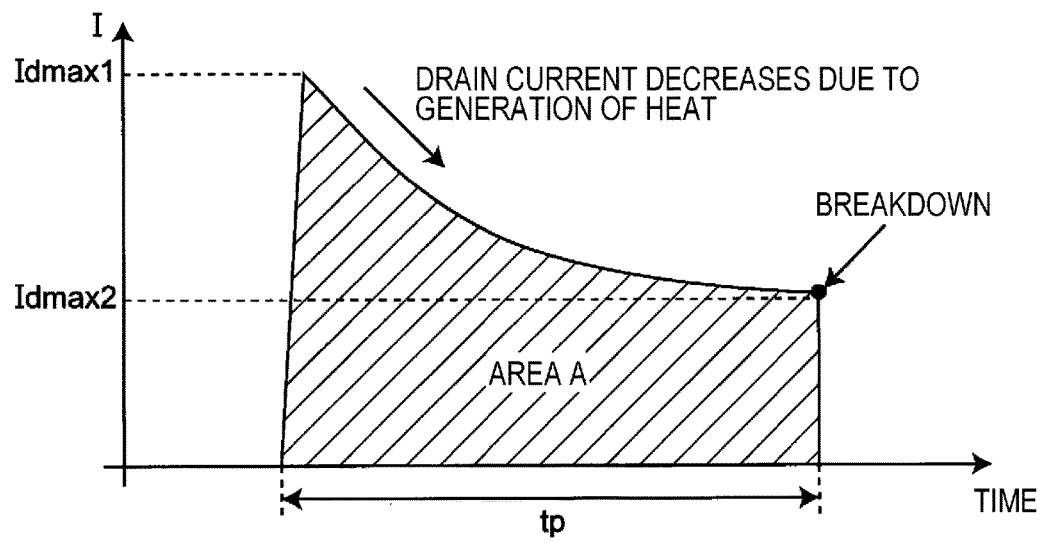
FIG. 5 is a diagram showing a change with passage of time in current flowing through a transistor element at the time of a load short.

FIG. 5 shows a change with passage of time in current flowing through the transistor element at the time of a load short. The horizontal axis represents time, and the vertical axis represents a drain current I.

Figure 6:
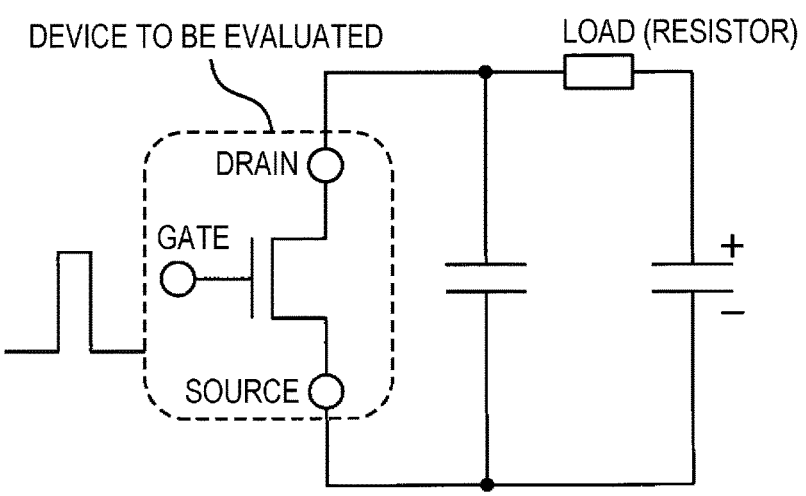
FIG. 6 is an equivalent circuit schematic view of a short-circuit withstand capacity evaluation apparatus.

At the time of a load short, a large current flows through the transistor element, and the drain current decreases with passage of time due to the generation of heat entailed by the energy of voltage multiplied by current, with the result that the element breaks down in a certain time period tp. In general, as shown in an equivalent circuit schematic view of a short-circuit withstand capacity evaluation apparatus shown in FIG. 6, the short-circuit withstand capacity is evaluated by bringing the gate into an on state in the presence of the application of a high voltage to the drain of the device to be evaluated.

It should be noted that, as will be described later, the in-plane average temperature of a two-dimensional electron gas at the time of the load short breakdown of a GaN HFET is calculated from information on Idmax1 and Idmax2 shown in FIG. 5 and temperature characteristic information on Idmax in the same device.

Since the GaN HFET is a surface operating device that operates with the two-dimensional electron gas as a carrier, the GaN HFET has such characteristics as to be higher in power density per unit volume and higher in near-surface temperature than a Si device.

In general, the GaN HFET is a wide-gap semiconductor, and is thus sufficiently low in intrinsic carrier concentration even at high temperatures. Therefore, in theory, the GaN HFET does not lose its semiconductor operation even with the bulk region at a temperature of 1000° C. or higher.

However, as a result of having evaluated an actual GaN HFET device in which a gate, a source, and a drain are formed over the bulk region, the inventors discovered that the in-plane average temperature in a two-dimensional electron gas at the time of a load short breakdown is approximately 400° C. and the breakdown at the time of a load short occurs at a temperature that is much lower than 1000° C., at which the device does not lose its semiconductor operation as a wide-gap semiconductor.

Figure 7:
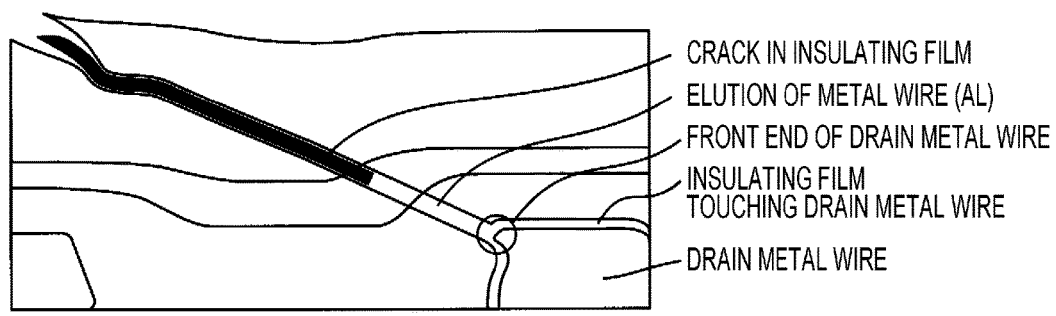
FIG. 7 is a diagram showing traces of an actual breakdown at the time of a load short.

Furthermore, as a result of having analyzed traces of a breakdown at the time of an actual load short, the inventors confirmed a crack in an insulating film and elution of a drain metal wire (Al) at the front end of the drain metal wire (see FIG. 7). The inventors thus discovered that the breakdown at the time of a load short is attributed to a crack in an insulating film touching a drain metal wire and elution of the drain metal wire.

It should be noted that, as will be described later, the inventors confirmed by a thermal simulation that in a case where the in-plane average temperature in a two-dimensional electron gas is approximately 400° C., the temperature of the front end of a drain metal wire is approximately 200° C. on the average in the plane of the chip. On this occasion, where the drain metal wire (Al) eluates, the central part of the chip or the like, which easily rises in temperature at the time of a load short, is locally at a temperature that is much higher than 200° C. and, for example, is estimated to be at a temperature that is equal to or higher than 660° C., which is the melting-point temperature of the drain metal wire (Al).

The inventors discovered from the above that the key to improvement in short-circuit withstand capacity is to reduce thermal stress in a place where thermal stress between an insulating film and a drain metal wire reaches its maximum at the time of a load short and that it is effective to reduce thermal stress at the time of a short circuit by providing a drain field plate portion as means to achieve such a reduction.

The following describes in detail nitride semiconductor devices of the present embodiment according to illustrated embodiments.

It should be noted that the drawings to be described below are schematic views for understanding the present invention and the shapes, the film thicknesses, and the like do not necessarily match those of actual devices. It should also be noted that the materials and the numerical values such as film thickness described for the purposes of illustration in each embodiment are mere examples.

First Embodiment

A first embodiment of the present invention gives a description of providing a drain field plate portion as means to reduce thermal stress.

FIG. 1 is a cross-sectional view of a normally-on GaN HFET serving as an example of a nitride semiconductor device according to the first embodiment of the present invention. This GaN HFET includes a drain field plate portion 19bf.

Figure 2:
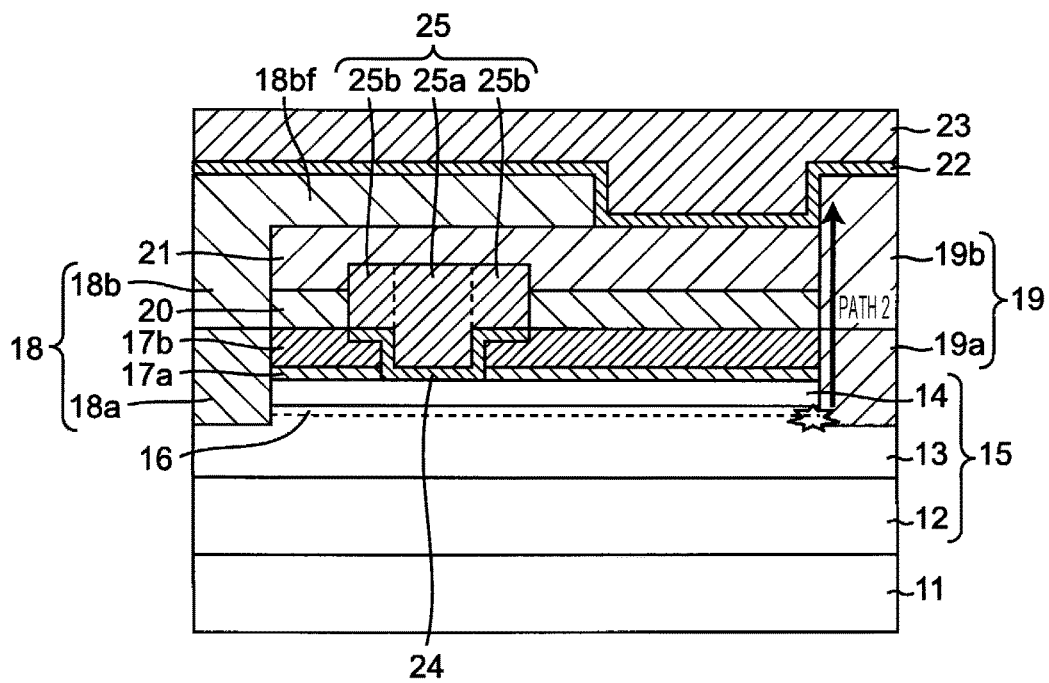
FIG. 2 is a cross-sectional view of a GaN HFET with no drain field plate portion.

Meanwhile, FIG. 2 is a cross-sectional view of a GaN HFET with no drain field plate portion 19bf as a reference example. Note here that those members in FIG. 2 which are identical to those in FIG. 1 are given the same reference signs.

It should be noted that, in the following, "DFP" denotes a drain field plate length that is defined by the distance of a projection from a drain ohmic electrode toward a source electrode.

As shown in FIG. 1, the GaN HFET according to the first embodiment includes a buffer layer 12 such as a superlattice formed over a Si substrate 11, an undoped GaN layer 13 serving as an example of a channel layer formed over the buffer layer 12, and an undoped AlGaN layer 14 serving as an example of a barrier layer formed over the undoped GaN layer 13. Moreover, the buffer layer 12, the undoped GaN layer 13, and the undoped AlGaN layer 14 constitute a nitride semiconductor layer 15.

Note here that a two-dimensional electron gas 16 is generated at an interface between the undoped GaN layer 13 and the undoped AlGaN layer 14. The two-dimensional electron gas 16 has its concentration set as appropriate within a range of, for example, $3 \times 10^{12}$ cm$^{-2}$ to $1 \times 10^{13}$ cm$^{-2}$.

The buffer layer 12 has a superlattice structure composed of laminated bodies laminated over a plurality of periods, assuming that each of these laminated bodies is obtained by growing, for example, AlGaN and AlN in one period. The buffer layer 12 has a film thickness of, for example, 2 μm. The film thickness may take on a preferred value as designed within a range of 0.5 μm to 5 μm.

Further, the undoped GaN layer 13 has a film thickness of, for example, 2 μm. The film thickness may take on a preferred value as designed within a range of 0.3 μm to 5 μm.

Further, the undoped AlGaN layer 14 has a film thickness that may take on a preferred value as designed within a range of 10 nm to 50 nm. However, since a threshold voltage becomes shallower as the film thickness of the undoped AlGaN layer 14 becomes thinner, it is possible to reduce the saturation current. Accordingly, for example, the film thickness of the undoped AlGaN layer 14 is set as appropriate at 35 nm or thinner (as will be described later).

Further formed over the undoped AlGaN layer 14 is a first insulating film 17a, such as a silicon nitride film, formed, for example, by using a plasma CVD method, with a second insulating film 17b formed by a silicon nitride film or the like over the first insulating film 17a.

Further formed is a source ohmic electrode 18a that reaches the two-dimensional electron gas 16 through the second insulating film 17b, the first insulating film 17a, and the undoped AlGaN layer 14. Further formed over the source ohmic electrode 18a is a source metal wire 18b. Moreover, the source ohmic electrode 18a and the source metal wire 18b constitute the source electrode 18.

Similarly, the drain electrode 19 is constituted by a drain ohmic electrode 19a that reaches the two-dimensional electron gas 16 through the second, insulating film 17b, the first insulating film 17a, and the undoped AlGaN layer 14 and a drain metal wire 19b formed over the drain ohmic electrode 19a.

The ohmic electrodes 18a and 19a are both formed by a laminated metal layer composed of titanium (Ti) and aluminum (Al). Further, the source electrode 18 and the drain electrode 19 are placed at a distance from each other.

Formed over the second insulating film 17b is a third insulating film 20, with an interlayer insulating film 21 formed over the third insulating film 20. Moreover, the source metal wire 18b of the source electrode 18 and the drain metal wire 19b of the drain electrode 19 pass through the third insulating film 20 and the interlayer insulating film 21 and extend in such directions as to face each other along a surface of the interlayer insulating film 21. A region of the source metal wire 18b that extends toward the drain metal wire 19b constitutes a source field plate portion 18bf. Meanwhile, a region of the drain metal wire 19b that extends toward the source metal wire 18b constitutes the drain field plate portion 19bf.

Moreover, a passivation film 22 and an interlayer insulating film 23 are formed in this order all over the interlayer insulating film 21 including the source metal wire 18b and the drain metal wire 19b.

Formed over the undoped AlGaN layer 14 between the source ohmic electrode 18a and the drain ohmic electrode 19a is the gate electrode 25, which reaches the interlayer insulating film 21 through the first insulating film 17a, the second insulating film 17b, and the third insulating film 20. Note here that the gate electrode 25 is constituted by Ni/Au or the like.

That is, in the first embodiment, the first insulating film is constituted by the first to third insulating film 17a, 17b, and 20. Meanwhile, the second insulating film is constituted by the passivation film 22.

The gate electrode 25 has a MISH (metal insulator semiconductor heterostructure) structure in which it is formed over the first insulating film 17a over the undoped AlGaN layer 14. Moreover, the gate electrode 25 is constituted by a base portion 25a and a gate field plate portion 25b. The base portion 25a is joined via a gate insulating film 24 to the undoped AlGaN layer (barrier layer) 14 of the nitride semiconductor layer 15. Further, the gate field plate portion 25b extends along the second insulating film 17b from, an upper part of the base portion 25a toward the source electrode 18 and toward the drain electrode 19.

In general, a power semiconductor is required to minimize the sum of a conduction loss and a switching loss, which is a loss at the time of a switching operation. It is especially important, for the GaN HFET, which has strength in high-frequency operations, to reduce the switching loss.

Moreover, it is necessary to minimize the output capacity of the GaN HFET in order to reduce the switching loss of the GaN HFET. For that purpose, the distance of extension of the drain metal wire 19b from the drain contact (drain ohmic electrode 19a) toward the source, i.e. the drain field plate length DFP, is minimized as shown, for example, in FIG. 2. This is because the capacitance between the drain electrode 19 and the Si substrate 11 is larger in the presence of the drain field plate portion 19bf as shown in FIG. 1 than in the absence of the drain field plate portion 19bf as shown in FIG. 2, with the result that the output capacity is larger.

Further, in the GaN HFET, a large current that is equivalent to the saturation current flows through the two-dimensional electron gas 16 under a high drain voltage at the time of a load short. Moreover, since a distribution of power density in the two-dimensional electron gas 16 is proportional to the production of a current density and an electric field, a temperature distribution normally exhibits a tendency which is similar to that of an electric field distribution. Further, since the electric field becomes larger on the drain side as the drain voltage becomes higher, a rise in temperature occurs in the two-dimensional electron gas 16 and, in particular, directly below the front end of the drain field plate portion 19bf.

On this occasion, in the case of FIGS. 1 and 2, the place where thermal stress between the insulating film (passivation film 22) and the drain metal wire 19b reaches its maximum is the front end of the drain metal wire 19b (i.e. the front end of the drain field plate portion 19bf). The following gives a detailed explanation.

Figure 16:
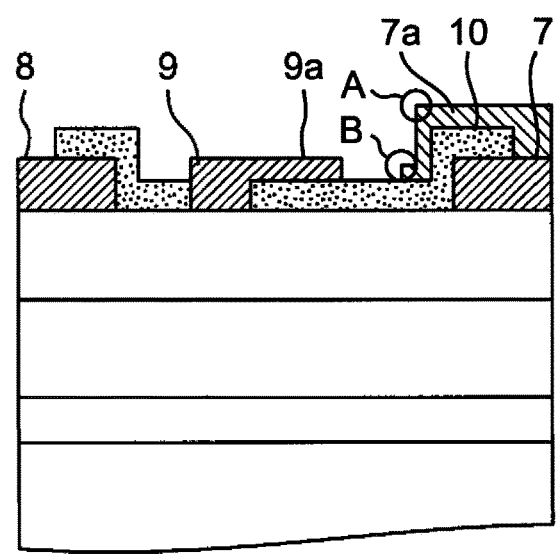
FIG. 16 is a cross-sectional view of a conventional field-effect transistor which is different from that of FIG. 15.

As mentioned above, while, at the time of a load short, a rise in temperature occurs in the two-dimensional electron gas 16 and, in particular, directly below the front end of the drain field plate portion 19bf, heat conduction causes a rise in temperature also in an adjacent part of the drain metal wire 19b. This results in generation of thermal stress between the drain metal wire 19b and the insulating film (passivation film 22), thus maximizing thermal stress especially at the front end of the drain metal wire 19b (i.e. the front end of the drain field plate portion 19bf). For example, as mentioned above, in the case of the structure of PTL 2 shown in FIG. 16, the regions A and B are two possible places where thermal stress between the insulating film and the drain metal wire reaches its maximum.

Now consider the conduction of heat to a place (e.g. the front end of the drain metal wire 19b) where thermal stress between the insulating film (passivation film 22) and the drain metal wire 19b reaches its maximum.

As mentioned above, the heat generated in the two-dimensional electron gas 16 directly below the front end of the drain field plate portion 19bf possibly passes as heat fluxes through the insulating films (i.e. the first insulating film 17a, the second insulating film 17b, and the third insulating film 20) along a path 1 and through the drain metal wire 19b via the two-dimensional electron gas 16 along a path 2. However, since the thermal conductivity of the insulating films is approximately 1/100 of that of GaN and Al, the path 2, which leads through the drain metal wire 19b via the two-dimensional electron gas 16, prevails.

Therefore, the temperature of a place where thermal stress between the insulating film 22 and the drain metal wire 19b reaches its maximum, e.g. of the front end of the drain metal wire 19b, takes on a value obtained by subtracting, from the temperature in the two-dimensional electron gas 16 directly below the front end of the drain field plate portion 19bf, the product of the heat flow ratio P [W] pertaining to the path 2 and the transient thermal resistance Rth [° C./W]. Therefore, for example, in a case where the transient thermal resistance Rth is low and the temperature of the front end of the drain metal wire 19b exceeds a critical temperature, an irreversible breakdown results from a crack in an insulating film (passivation film 22) located near the front end of the drain metal wire 19b and elution of the metal wire.

As mentioned above, the inventors actually confirmed traces of a breakdown at the time of a load short and discovered a crack in an insulating film at the front end of a drain metal wire and, furthermore, elution of the drain metal wire into the crack part as shown in FIG. 7.

Furthermore, by performing a thermal simulation of a device of the same structure as the device that short-circuited and broke down as mentioned above, the inventors confirmed a distribution of temperature in the two-dimensional electron gas. As a result, the inventors confirmed that the in-plane average temperature in the two-dimensional electron gas was approximately 400° C., which was much the same as the actual measurement. Further, in so doing, the inventors also confirmed that the temperature of the front end of the drain metal wire was approximately 200° C. in terms of the in-plane average temperature.

The following discusses thermal stress and the tensile strength (breakdown strength) of a passivation film.

In general, a high-voltage and large-current transverse field-effect transistor requires a thick and wide drain metal wire to withstand a high current density. Therefore, the generation of local heat in a short circuit condition or the like causes high stress to be generated by a mismatch of coefficients of thermal expansion between a drain metal wire and a passivation film.

Referring to FIG. 1, the following explains stress that is generated in the case of generation of heat due to the flow of a large current at the time of a short circuit and, in particular, between the front end of the drain metal wire 19b and the passivation film 22 (such as SiN). Note here that, assuming that $\Delta T$ is the rise in temperature of the drain metal wire 19b, $\Delta \sigma$ is the amount of increase in stress that is generated by a mismatch of coefficients of thermal expansion, $\alpha_{Al}$ is the coefficient of thermal expansion of a wire of aluminum, $\alpha_{SiN}$ is the coefficient of thermal expansion of the passivation film 22 such as SiN, and $E_{SiN}$ the Young's modulus of SiN, $\Delta \sigma$ can be expressed by Formula (1):

$$\Delta \sigma = E_{SiN} \cdot (\alpha_{Al} - \alpha_{SiN}) \cdot \Delta T \qquad (1)$$

Assuming that the temperature of Al becomes, for example, 200° C. at the time of a short circuit, it is found from Formula (1) that $$\Delta \sigma = 200 \text{ [GPa]} \times 23 \times 10^{-6} [° C.^{-1}] \times 200 [° C.] = 920 \text{ MPa},$$

and it is estimated from the tensile strength of the passivation film 22 such as a SiN film that the level is sufficient for a crack to occur.

Since, although the temperature of the front end of the drain metal wire 19b at the time of a short circuit is approximately 200° C. on the average in the plane of the chip, the metal wire eluates, the central part of the chip or the like, which easily rises in temperature at the time of a short circuit, is locally at a much higher temperature, and is estimated to be at a temperature that is equal to or higher than 660° C., which is the melting-point temperature of the drain metal wire (Al) 19b.

That is, for improvement in short-circuit withstand capacity, it is effective to reduce the temperature of a place where thermal stress between the insulating film and the drain metal wire reaches its maximum, e.g. of the front end of the drain metal wire, and it is desirable to increase means for increasing the product of the heat flow ratio P [W] and the transient thermal resistance Rth [° C./W], e.g. the transient thermal resistance Rth.

The distance from directly below the front end of the drain field plate portion 19*bf* in the two-dimensional electron gas 16 to the front end of the drain metal wire 19*b* is longer in the presence of the drain field plate portion 19*bf* as shown in FIG. 1 than in the absence of the drain field plate portion 19*bf* as shown in FIG. 2, so that the transient thermal resistance Rth is higher.

Therefore, for improvement in short-circuit withstand capacity, it is desirable to provide the drain field plate portion 19*bf* as means to reduce thermal stress in a place where thermal stress between the insulating film 22 and the drain metal wire 19*b* reaches its maximum, at the time of a load short.

Figure 3:
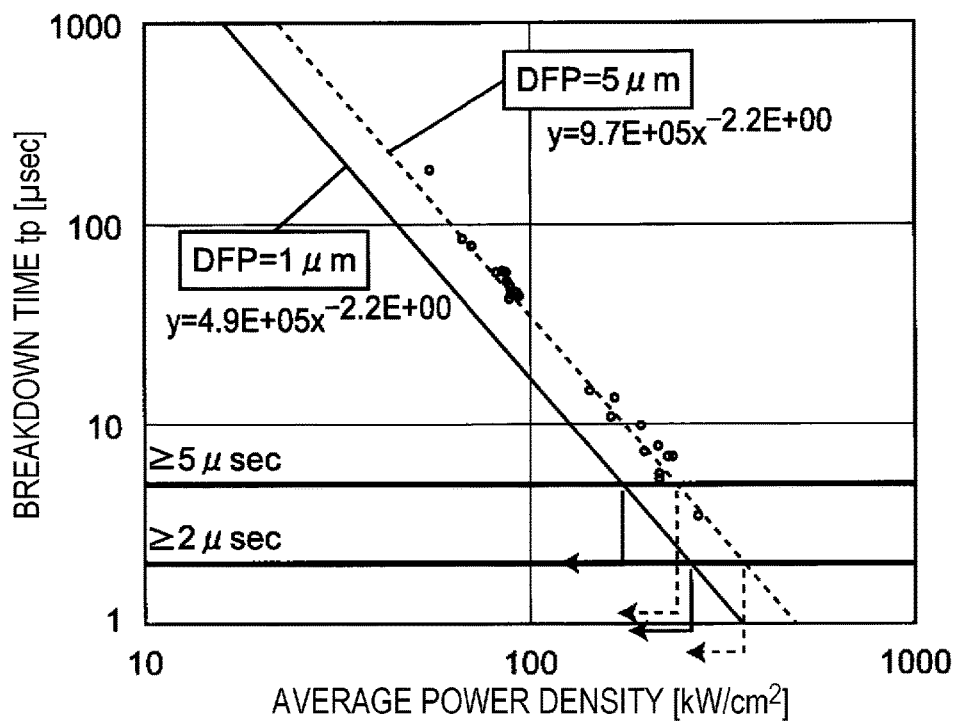
FIG. 3 is a diagram showing a correlation between the average power density at the time of a short circuit and the breakdown time.

Next, the inventors performed a short-circuit evaluation on a structure in which the drain field plate length DFP is for example DFP=5 μm. As a result, the inventors found that, as shown in FIG. 3, in the correlation between the average power density (hereinafter simply referred to as "power density"), which is the product of the drain current density (Id/S) and the drain voltage Vd at the time of a short circuit, and the short-circuit withstand capacity (breakdown time), the short-circuit withstand capacity (breakdown time) tp is on a single correlation line on which it is proportional to substantially the "negative square" of the power density and a breakdown occurs at an average temperature (e.g. approximately 400° C.) in the same two-dimensional electron gas 16. Note here that the power density is calculated by dividing, by the after-mentioned element area, the integrated value of Idmax shown in FIG. 5, i.e. the integrated average value obtained by dividing the area A in the drawing by the time period tp.

In theory, assuming that ΔTj [° C.] is the rise in in-plane average temperature in the two-dimensional electron gas 16 as entailed by the generation of heat, Zth [° C./W] is the transient thermal resistance of the element, and Pd [W] is the energy at the time of a short circuit, ΔTj can be expressed by Formula (2):

$$\Delta Tj = Zth \times Pd \quad (2)$$

Note here that, assuming that tp [sec] is the breakdown time it takes for the element to break down and K is the constant of proportionality, Formula (2) can be transformed into Formula (3), as the transient thermal resistance Zth is substantially proportional to the half square of the breakdown time tp:

$$\Delta Tj \approx K \cdot (tp)^{0.5} \cdot Pd \quad (3)$$

Further, the constant of proportionality K can be expressed by K=(M/S), where S [cm²] is the element area. Therefore, assuming that Id [A] is the drain current at the time of a short circuit and Vd [V] is the drain voltage, Formula (3) can be expressed as follows:

$$\Delta Tj \approx (M/S) \cdot (tp)^{0.5} \cdot Pd \quad (4)$$
$$= M \cdot (tp)^{0.5} \cdot (Id/S) \cdot Vd$$

It should be noted that the element area S is expressed by S=Lsd×W [cm²], where Lsd [cm] is the source-drain pitch and W[cm] is the gate width. Therefore, from Formula (4), the short-circuit withstand capacity (breakdown time) tp can be expressed by Formula (5):

$$tp = (\Delta Tj/M)^2 \times ((Id/S) \times Vd)^{-2} \quad (5)$$

Assume that in a case where, at the time of a short circuit, a large current flows through the element and the element breaks down due to the generation of heat entailed by the energy of voltage multiplied by current, the element breaks down at a certain critical temperature. Then, ΔTj=ΔTc (constant), and Formula (5) turns into Formula (6):

$$tp = (\Delta Tc/M)^2 \times ((Id/S) \times Vd)^{-2} \quad (6)$$

Therefore, the breakdown time tp is proportional to substantially the "negative square" of the product of the drain current density (Id/S) and the drain voltage Vd at the time of a short circuit.

As mentioned above, the inventors discovered that, as shown in FIG. 3, in the correlation between the power density at the time of a short circuit and the short-circuit withstand capacity (breakdown time), the short-circuit withstand capacity (breakdown time) tp is on a single correlation line on which it is proportional to substantially the "negative square" of the power density.

Furthermore, the inventors clarified from theoretical considerations based on the transient thermal resistance Zth that a breakdown at the time of a short circuit occurs in the case of a certain average temperature (e.g. approximately 400° C.) in the two-dimensional electron gas 16.

This shows that, for improvement in short-circuit withstand capacity (breakdown time), it is only necessary to provide the drain field plate portion 19*bf* and, furthermore, reduce the power density on the basis of the correlation line.

Meanwhile, as for the short-circuit withstand capacity in a case where an output side load is short-circuited, the device is required to withstand without breaking down for at least a period of 2 μsec, preferably a period of 5 μsec, even in the presence of the application of a drain voltage of 400 V.

Therefore, for example, in a case where DFP=5 μm in the GaN HFET, it is only necessary that, as shown in FIG. 3, the product of the drain current density (Id/S) and the drain voltage Vd at the time of a short circuit fall within a range of 360 kW/cm² or lower and it is desirable that the product fall within 3.6×10⁵/Vd [A/cm²] or lower in terms of the drain current density (Id/S) at the time of a short circuit, assuming that the target value of the short-circuit withstand capacity (breakdown time) in the presence of the application of a drain voltage of 400 V is 2 μsec or longer.

More preferably, it is only necessary that, as shown in FIG. 3, the product of the drain current density (Id/S) and the drain voltage Vd at the time of a short circuit fall within a range of 240 kW/cm² or lower and it is desirable that the product fall within 2.4×10⁵/Vd [A/cm²] or lower in terms of the drain current density (Id/S) at the time of a short circuit, assuming, for example, that the target value of the short-circuit withstand capacity (breakdown time) in the presence of the application of a drain voltage of 400 V is 5 μsec or longer.

As mentioned above, the output capacity becomes lower as the drain field plate length DFP becomes shorter, and this is advantageous in reducing the switching loss. The following explains a correlation between the power density and the short-circuit withstand capacity (breakdown time), for example, in a structure in which DFP=1 μm.

As shown in FIG. 3, in the structure in which DFP=1 μm as compared with the case where DFP=5 μm, the distance from directly below the front end of the drain field plate portion 19bf in the two-dimensional electron gas 16 to the front end of the drain metal wire 19b is shorter, so that the transient thermal resistance Rth is lower, as mentioned above. This causes a rise in temperature of the front end of the drain field plate portion 19bf. A result of a thermal simulation shows that the short-circuit withstand capacity (breakdown time) is shorter, for example, by approximately ½ in the case of a structure in which DFP=1 μm than in the case where DFP=5 μm.

Therefore, for example, in a case where DFP=1 μm in the GaN HFET, it is only necessary that, as shown in FIG. 3, the product of the drain current density (Id/S) and the drain voltage Vd at the time of a short circuit fall within a range of 260 kW/cm² or lower and it is desirable that the product fall within $2.6 \times 10^5/Vd$ [A/cm²] or lower in terms of the drain current density (Id/S) at the time of a short circuit, assuming that the target value of the short-circuit withstand capacity (breakdown time) in the presence of the application of a drain voltage of 400 V is 2 μsec or longer.

More preferably, it is only necessary that, as shown in FIG. 3, the product of the drain current density (Id/S) and the drain voltage Vd at the time of a short circuit fall within a range of 175 kW/cm² or lower and it is desirable that the product fall within $1.75 \times 10^5/Vd$ [A/cm²] or lower in terms of the drain current density (Id/S) at the time of a short circuit, assuming, for example, that the target value of the short-circuit withstand capacity (breakdown time) in the presence of the application of a drain voltage of 400 V is 5 μsec or longer.

As described above, in the first embodiment, the drain metal wire 19b is formed over the drain ohmic electrode 19a of the drain electrode 19, and the drain field plate portion 19bf extending in a direction toward the source metal wire 18b along the surface of the interlayer insulating film 21 is formed as an upper part of the drain metal wire 19b.

This makes it possible to increase the transient thermal resistance Rth of the path 2 along which the heat generated in the two-dimensional electron gas 16 directly below the front end of the drain field plate portion 19bf passes through the drain metal wire 19b via the two-dimensional electron gas 16. That is, this makes it possible to increase the product of the heat flow ratio P [W] and the transient thermal resistance Rth [° C./W] and lower the temperature of the place where thermal stress between the insulating film (passivation film 22) and the drain metal wire 18b reaches its maximum, i.e. of the front end of the drain field plate portion 19bf.

This in turn makes it possible to, at the time of a load short, reduce thermal stress in the place where thermal stress between the insulating film 22 and the drain metal wire 19b reaches its maximum. This makes it possible to prevent a crack in the insulating film 22 touching the drain metal wire 19b and elution of the drain electrode 19 into the crack, thus making it possible to improve the short-circuit withstand capacity.

Further, as can be seen from Formula (6), the breakdown time tp it takes for the element to break down is proportional to substantially the "negative square" of the power density represented by the product of the drain current density (Id/S) and the drain voltage Vd at the time of a short circuit. Meanwhile, in a case where the output side load is short-circuited, a breakdown time of 2 μsec or longer is required even in the presence of the application of a drain voltage of 400 V.

Therefore, in the GaN HFET, a short-circuit withstand capacity (breakdown time) of 2 μsec or longer can be attained by setting the drain field plate length DFP at 5 μm or longer and setting the power density at 360 kW/cm² or lower. Further, in a case of setting the drain field plate length DFP at 1 μm or longer in order to reduce the switching loss by making the drain field plate length DFP shorter, a short-circuit withstand capacity (breakdown time) of 2 μsec or longer can be attained by setting the power density at 260 kW/cm² or lower. Further, in a case of setting the drain field plate length DFP at 1 μm or longer, it is preferable, from the point of view of surely attaining a short-circuit withstand capacity (breakdown time) of 2 μsec or longer, that the power density be set at 175 kW/cm² or lower.

Although, in the first embodiment, the gate electrode 25 is formed over the nitride semiconductor layer 15 with the gate insulating film 24 sandwiched therebetween, the gate electrode 25 may be formed directly on the nitride semiconductor layer 15. That is, the gate insulating film 24 does not need to be formed.

Second Embodiment

A second embodiment of the present invention gives a description of a transistor structure for reducing the drain current (saturation current), i.e. for reducing the power density.

In the second embodiment, as in the case of the first embodiment, a normally-on GaN HFET is described as an example of a nitride semiconductor device of the present invention. Note here that the GaN HFET according to the second embodiment has exactly the same structure as the GaN HFET according to the first embodiment. Therefore, the following description refers to the cross-sectional view shown in FIG. 1 in the first embodiment.

The GaN HFET is configured such that, as shown in FIG. 1, the gate length Lg is defined by the width of the base portion 25a of the gate electrode 25. As the gate length Lg becomes longer, the saturation current can become smaller. Therefore, for improvement in short-circuit withstand capacity, it is desirable to set the gate length Lg at the largest possible value while taking into account a trade-off with on resistance.

Further, for a reduction of the drain current (saturation current), i.e. for a reduction of the power density, it is desirable to design the gate length Lg and the film thickness of the AlGaN layer (barrier layer) 14 to the following effect.

Figure 8:
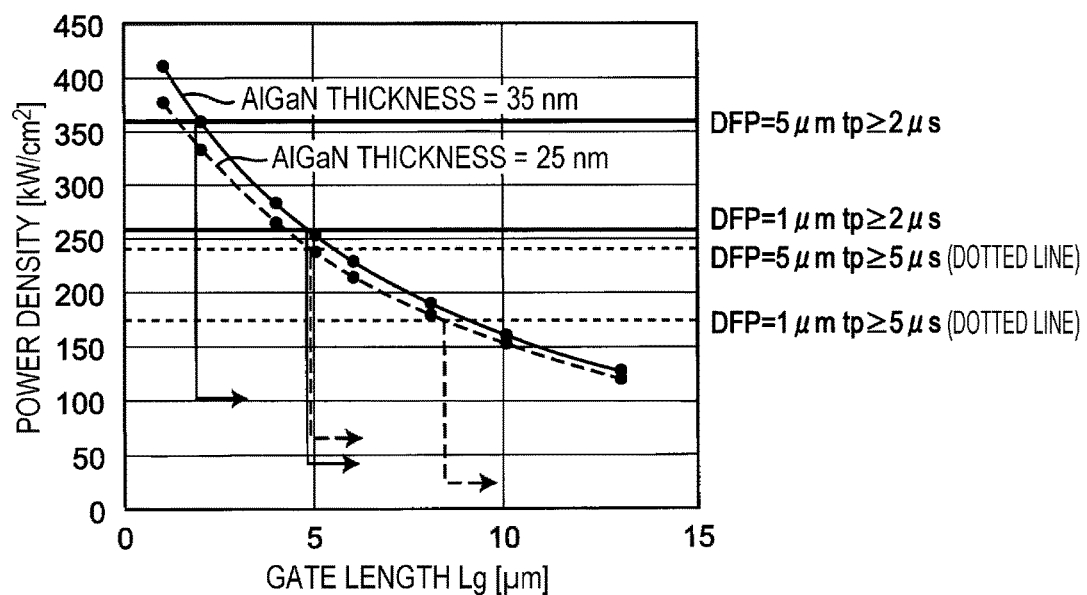
FIG. 8 is a diagram showing the effect of the film thickness of an undoped AlGaN layer on the dependence of the power density at the time of a load short on the gate length.

FIG. 8 shows the dependence of the gate length Lg on the power density at the time of a load short in the presence of the application of a drain voltage of 400 V, for example, in cases where the film thickness of the AlGaN layer 14 is 25 nm and 35 nm, respectively.

As can be seen from FIG. 8, in a case where the target value of the short-circuit withstand capacity (breakdown time) in the presence of the application of a drain voltage of 400 V is set at 2 μsec or longer with the drain field plate length DFP being for example DFP=1 μm, it is necessary that the power density be 260 kW/cm² or lower and it is desirable to set the film thickness of the AlGaN layer 14 at 35 nm or thinner and, furthermore, set the gate length Lg at 5 μm or longer. Further, in a case where the target value of the short-circuit withstand capacity (breakdown time) in the presence of the application of a drain voltage of 400 V is set at 5 μsec or longer, it is necessary that the power density be 175 kW/cm² or lower and it is desirable to set the film thickness of the AlGaN layer 14 at 25 nm or thinner and, furthermore, set the gate length Lg at 8.5 μm or longer.

Next, in a case where the target value of the short-circuit withstand capacity (breakdown time) in the presence of the application of a drain voltage of 400 V is set at 2 μsec or longer with the drain field plate length DFP being for example DFP=5 μm, it is necessary that the power density be 360 kW/cm² or lower and it is desirable to set the film thickness of the AlGaN layer 14 at 35 nm or thinner and, furthermore, set the gate length Lg at 2 μm or longer. Further, in a case where the target value of the short-circuit withstand capacity (breakdown time) in the presence of the application of a drain voltage of 400 V is set at 5 μsec or longer, it is necessary that the power density be 240 kW/cm² or lower and it is desirable to set the film thickness of the AlGaN layer 14 at 25 nm or thinner and, furthermore, set the gate length Lg at 5 μm or longer.

Figure 9:
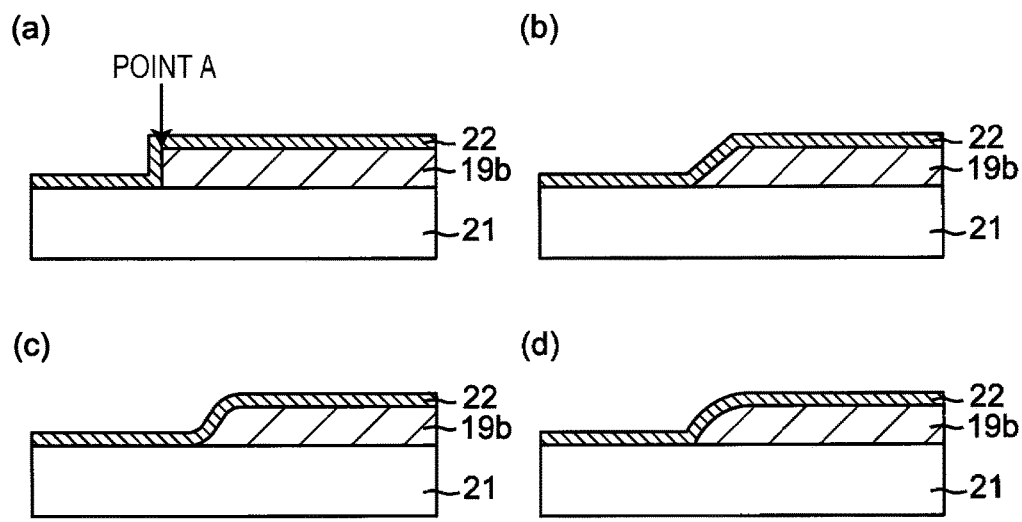
FIG. 9 illustrates diagrams each showing the shape of the front end of a foundation drain metal wire.

Further, since the tensile strength of the insulating film (passivation film 22) at the front end of the drain metal wire 19b, i.e. the front end of the drain field plate portion 19bf) depends greatly on the shape of the foundation drain metal wire 19b, it is desirable that, as shown in FIG. 9, the front end of the drain metal wire 19b has an inclined surface that projects from an upper surface toward a mask. In that case, the inclined surface may be linear as shown in FIG. 9(b), or the inclined surface may be curved in a concave or convex shape as shown in FIG. 9(c) or FIG. 9(d). In either case, the insulating film has a much higher tensile strength than in the absence of an inclined surface as indicated by the point A in FIG. 9(a).

It should be noted that the first and second embodiments assume that the element breaks down when the in-plane average temperature in the two-dimensional electron gas 16 at the time of a load short is for example approximately 400° C. However, it is self-evident that the breakdown temperature at the time of a load short is not limited to this temperature but varies depending on conditions such as the device structure and the drain voltage at the time of a load short.

Further, the first and second embodiments assume that the element breaks down when the in-plane average temperature of the front end of the drain metal wire 19b at the time of a load short is for example approximately 200° C. However, it is self-evident that the breakdown temperature of the front end of the drain metal wire 19b is not limited to this temperature but varies depending on conditions such as the device structure and the drain voltage at the time of a load short.

It should be noted that the substrate 11 is not limited to Si but may be replaced by a sapphire substrate or an SiC substrate. Alternatively, the substrate 11 may be replaced by a sapphire substrate or an SiC substrate having a nitride semiconductor layer grown thereon or, as in the case of, for example, the growth of an AlGaN layer on a GaN substrate, may be replaced by a nitride semiconductor substrate having a nitride semiconductor layer grown thereon.

Further, a buffer layer may be formed as needed between the substrate and each layer.

Further, an AlN layer having a layer thickness of approximately 1 nm may be formed as a hetero-improved layer between the undoped GaN layer 13 and the undoped AlGaN layer 14.

Further, an GaN cap layer may be formed over the undoped AlGaN layer 14.

As described above, the GaN HFET is configured such that as the gate length Lg becomes longer, the saturation current can become smaller. Therefore, for improvement in short-circuit withstand capacity, it is desirable to set the gate length Lg at the largest possible value while taking into account a trade-off with on resistance.

In the second embodiment, when the target value of the short-circuit withstand capacity (breakdown time) in the presence of the application of a drain voltage of 400 V is set at 2 μsec or longer with the drain field plate length DFP being for example DFP=5 μm, it is necessary that the power density be 360 kW/cm² or lower. Therefore, it is desirable to set the film thickness of the AlGaN layer 14, which is a barrier layer, at 35 nm or thinner and, furthermore, set the gate length Lg at 2 μm or longer.

That is, this makes it possible to set the gate length Lg at 2 μm or longer, thus making it possible to bring about improvement in short-circuit withstand capacity by reducing the saturation current.

Third Embodiment

A third embodiment of the present invention gives a description of a method for improving heat dissipation with which to, for improvement in short-circuit withstand capacity, reduce thermal stress in a place where thermal stress between the insulating film and the drain metal wire reaches its maximum at the time of a load short.

For improvement in the short-circuit withstand capacity (breakdown time), it is important to increase (ΔTc/M), where, as shown in Formula (6) in the first embodiment, ΔTc [° C.] is the temperature rise to the critical temperature in the in-plane average temperature in the two-dimensional electron gas 16 at the time when the element breaks down and M is the constant of proportionality.

Figure 10:
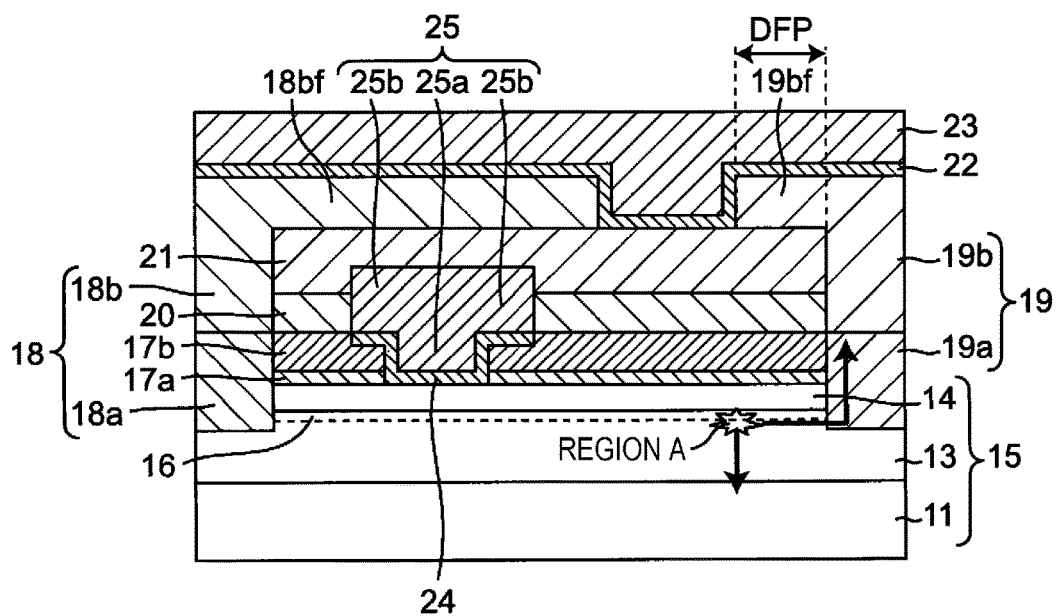
FIG. 10 is a cross-sectional view of a GaN HFET which is different from that of FIG. 1.

FIG. 10 is a cross-sectional view of a normally-on GaN HFET according to the third embodiment of the present invention. This GaN HFET is configured in basically the same manner as the GaN HFET according to the first embodiment. Therefore, those members in FIG. 10 which are identical to those in FIG. 1 of the first embodiment are given the same reference signs and, as such, are not described in detail below.

The GaN HFET according to the third embodiment makes it possible to reduce the M value, i.e. to improve heat dissipation at the time of a short circuit (reduce the transient thermal resistance Zth), thus making it possible to improve the short-circuit withstand capacity (breakdown time).

The following describes in detail means for reducing the M value, i.e. for reducing the transient thermal resistance Zth in the short-circuit withstand capacity (breakdown time) (several microseconds to several tens of microseconds).

As shown in FIG. 10, the GaN HFET according to the third embodiment does not include a superlattice layer, i.e. the buffer layer 12 composed of a plurality of laminated bodies obtained by growing AlGaN and AlN and repeatedly laminated as shown in FIG. 1 of the first embodiment.

For example, in a case where, at the time of a load short, heat is generated in the region A in the two-dimensional electron gas 16 directly below the front end of the drain metal wire 19b in FIG. 10, the heat conducts both toward the Si substrate 11 and upward through the drain ohmic electrode 19a as indicated by arrows. However, since the heat conducts a distance of several micrometers to several tens of micrometers in a breakdown time of several microseconds to several tens of microseconds, the dissipation of heat toward the Si substrate 11 is restricted especially in the presence of the buffer layer 12 of a superlattice layer structure that is poor in thermal conductivity. This causes the heat to be trapped, with the result that a breakdown due to the generation of neat is remarkable.

As a result of a thermal simulation performed on a rise in temperature after 2 µsec in a case where the drain field plate length DFP is DFP=5 µm, it was found that the rise in temperature in the presence of the superlattice layer (buffer layer 12) is reduced to 78% of the rise in temperature in the absence of the superlattice layer.

Therefore, according to the third embodiment, the M value can be reduced to 78% of that in the presence of the superlattice layer, and according to Formula (6)

$$tp=(\Delta Tc/M)^2 \times ((Id/S) \times Vd)^{-2},$$

the short-circuit withstand capacity (breakdown time) tp is proportional to $(1/M)^2$, provided the current density (Id/S), the drain voltage Vd, and Ale are equal. This makes it possible to significantly improve the short-circuit withstand capacity (breakdown time) by $(1/0.78)^2=1.6$ times.

Figure 11:
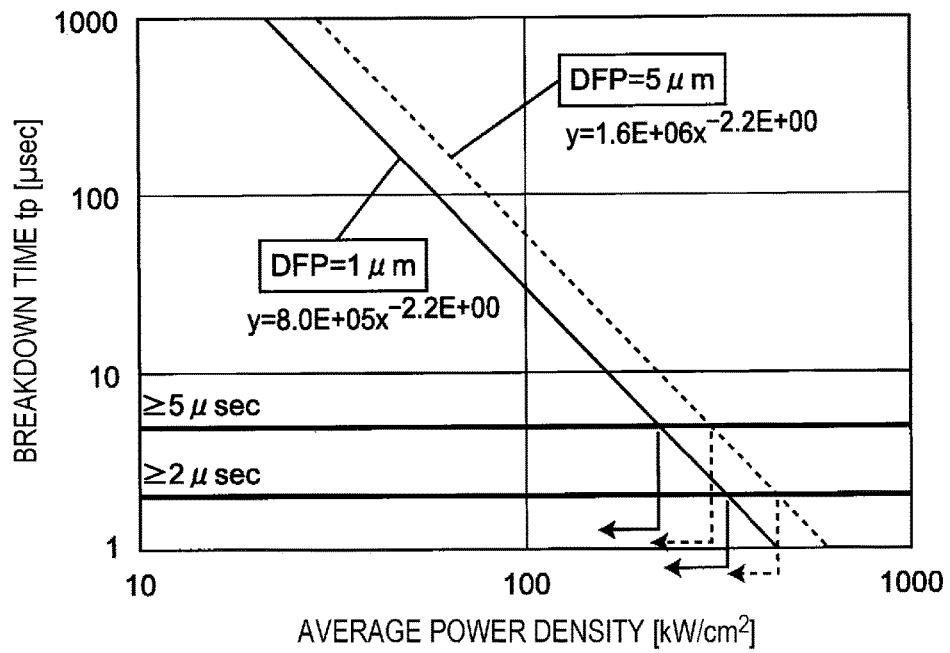
FIG. 11 is a diagram showing a correlation between the average power density at the time of a short circuit and the breakdown time in the GaN HFET shown in FIG. 10.

Therefore, the short-circuit withstand capacity (breakdown time) tp is plotted as shown in FIG. 11 with respect to the product (power density) of the drain current density (Id/S) and the drain voltage Vd at the time of a short circuit. That is, assuming, for example, that the target value of the short-circuit withstand capacity (breakdown time) in the presence of the application of a drain voltage of 400 V is 2 µsec or longer, it is only necessary that the product of the drain current density (Id/S) and the drain voltage Vd at the time of a short circuit fall within a range of 450 kW/cm² or lower and it is desirable that the product fall within $4.5 \times 10^5$/Vd [A/cm²] or lower in terms of the drain current density (Id/S) at the time of a short circuit.

More preferably, assuming, for example, that the target value of the short-circuit withstand capacity (breakdown time) in the presence of the application of a drain voltage of 400 V is 5 µsec or longer, it is only necessary that the product of the drain current density (Id/S) and the drain voltage Vd at the time of a short circuit fall within a range of 300 kW/cm² or lower and it is desirable that the product fall within $3.0 \times 10^5$/Vd [A/cm²] or lower in terms of the drain current density (Id/S) at the time of a short circuit.

As mentioned above, the output capacity becomes lower as the drain field plate length DFP becomes shorter, and this is advantageous in reducing the switching loss. The following explains a correlation between the power density and the short-circuit withstand capacity (breakdown time), for example, in a case where DFP=1 µm.

As shown in FIG. 11, in the case where DFP=1 µm as compared with the case where DFP=5 µm, the distance from directly below the front end of the drain field plate portion 19bf in the two-dimensional electron gas 16 to the front end of the drain metal wire 19b is shorter, so that the transient thermal resistance Rth is lower, as mentioned above. This causes a rise in temperature of the front end of the drain field plate portion 19bf. A result of a thermal simulation shows that the short-circuit withstand capacity (breakdown time) is shorter, for example, by approximately ½ in the case where DFP=1 µm than in the case where DFP=5 µm.

Therefore, for example, in a case where DFP=1 µm in the GaN HFET, it is only necessary that, as shown in FIG. 11, the product of the drain current density (Id/S) and the drain voltage Vd at the time of a short circuit fall within a range of 330 kW/cm² or lower and it is desirable that the product fall within $3.3 \times 10^5$/Vd [A/cm²] or lower in terms of the drain current density (Id/S) at the time of a short circuit, assuming that the target value of the short-circuit withstand capacity (breakdown time) in the presence of the application of a drain voltage of 400 V is 2 µsec or longer.

More preferably, it is only necessary that, as shown in FIG. 11, the product of the drain current density (Id/S) and the drain voltage Vd at the time of a short circuit fall within a range of 220 kW/cm² or lower and it is desirable that the product fall within $2.2 \times 10^5$/Vd [A/cm²] or lower in terms of the drain current density (Id/S) at the time of a short circuit, assuming, for example, that the target value of the short-circuit withstand capacity (breakdown time) in the presence of the application of a drain voltage of 400 V is 5 µsec or longer.

It should be rioted that although the third embodiment is structured not to include a superlattice layer, it needs only improve the heat dissipation of the substrate and, for example, may use an Al-composition-graded buffer layer or the like.

Note here that the Al-composition-graded buffer layer is an AlGaN layer which is used to reduce warpages and defects resulting from a difference in lattice constant and a difference in coefficient of thermal expansion between the Si substrate and the nitride semiconductor and which has gradual or grated variations in Al composition from the Si substrate toward the first and second insulating films 17a and 17b, and is higher in thermal conductivity than a superlattice layer.

In a case where, at the time of a load short, heat is generated in in the two-dimensional electron gas 16 directly below the front end of the drain metal wire 19b, the heat conducts both toward the Si substrate 11 and upward through the drain ohmic electrode 19a. However, the dissipation of heat toward the Si substrate 11 is restricted in the presence in the nitride semiconductor layer 15 of the buffer layer 12 of a superlattice layer structure that is poor in thermal conductivity.

As described above, in the third embodiment, the nitride semiconductor layer 15 does not include the superlattice buffer layer 12 composed of a plurality of laminated bodies obtained by growing AlGaN and AlN and repeatedly laminated. Therefore, the power density at the time of a short circuit can be 450 kW/cm² or lower, assuming that the drain field plate length DFP is 5 µm or longer and the target value of the short-circuit withstand capacity (breakdown time) in the presence of the application of a drain voltage of 400 V is 2 µsec or longer.

Therefore, a breakdown time tp of 2 µsec or longer can be attained even with a higher power density at the time of a load short than in a case where the nitride semiconductor layer 15 includes a superlattice layer. That is, further improvement in short-circuit withstand capacity can be brought about than in the case of a structure in which the nitride semiconductor layer 15 includes a superlattice layer.

Fourth Embodiment

Figure 12:
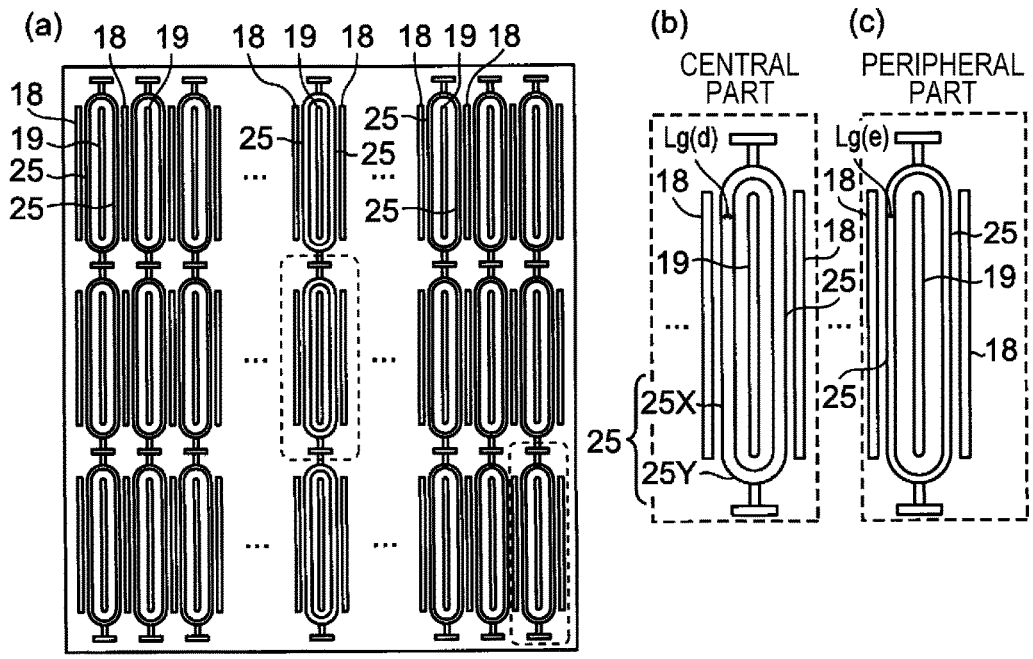
FIG. 12 illustrates plan views of a GaN HFET which is different from those of FIGS. 1 and 10.

FIG. 12 illustrates schematic plan views of a normally-on GaN HFET serving as an example of a nitride semiconductor device according to a fourth embodiment of the present invention. The GaN HFET according to the fourth embodiment has substantially the same cross-sectional structure as that of the GaN HFET according to the first embodiment. Therefore, the following gives the same reference signs to the same members as those of the first embodiment and omits a detailed description of those members.

It should be noted that FIG. 12(a) is a plan view of a GaN HFET chip (hereinafter simply referred to as "chip") composed of such GaN HFETs arranged in a matrix. Further, FIG. 12(b) is an enlarged plan view of a GaN HFET located in a central part of the chip. Further, FIG. 12(c) is an enlarged plan view of a GaN HFET located in a peripheral part of the chip.

As shown in FIG. 12(b) and FIG. 12(c), the GaN HFET according to the fourth embodiment is configured such that, in a plan view, a plurality of finger-shaped drain electrodes 19 and source electrodes 18 are arranged alternately and parallel to each other and a gate electrode 25 is located between a drain electrode 19 and source electrodes 18 and disposed so as to surround the drain electrode 19. That is, the gate electrode 25 is constituted by finger inner side portions 25X extending in a longitudinal direction parallel to the drain electrode 19 and the source electrodes 18 and finger outer end portions 25Y curved in a semicircular arc shape and connecting the finger inner side portions 25X adjacent to each other with the drain electrode 19 interposed therebetween.

It should be noted that the gate electrode 25 does not necessarily need the finger outer end portions 25Y and may by constituted only by the finger inner side portions 25X.

In a plan view, the finger outer end portions 25Y extend so as to surround both ends, respectively, of the drain electrode 19 and forms a race-track-shaped gate electrode 25 by continuing into ends of the two finger inner side portions 25X adjacent to each other with the drain electrode 19 interposed therebetween.

In the fourth embodiment and each of the following embodiments, the unit of counting of GaN HFETs is a set of two GaN HFETs having such a race-track-shaped gate electrode 25 and sharing a drain electrode 19 surrounded by the race-track-shaped gate electrode 25.

In the fourth embodiment, the gate lengths Lg(d) of finger-shaped gate electrodes 25 in one GaN HFET located in the central part of the chip are longer than the gate lengths Lg(e) of finger-shaped gate electrodes 25 located in the peripheral part of the chip.

It should be noted that the GaN HFET according to the fourth embodiment differs only in the planar shape of a gate electrode 25 and is exactly the same in cross-sectional shape as the GaN HFETs according to the first to third embodiments.

According to the fourth embodiment, as mentioned above, the gate length Lg(d) of a finger-shaped gate electrode 25 located in the central part of the chip is longer than the gate length Lg(e) of a finger-shaped gate electrode 25 located in the peripheral part of the chip. This makes it possible to minimize an increase in on resistance per unit area and reduce the saturation current in the central part of the chip, which easily rises in temperature at the time of a short circuit, thus making it possible to reduce generation of heat.

This makes it possible to improve the short-circuit withstand capacity of the element while maintaining the characteristics of the HFET such as reductions in leak current and on resistance, thus making it possible to achieve a nitride semiconductor device with improved reliability.

Fifth Embodiment

Figure 13:
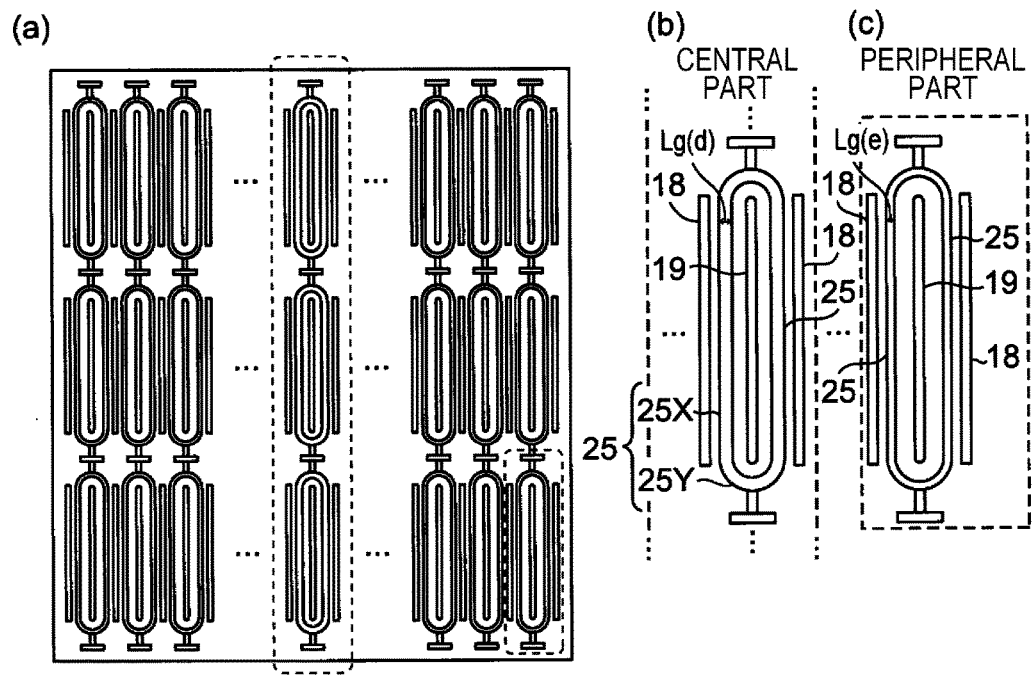
FIG. 13 illustrates plan views of a GaN HFET which is different from that of FIG. 12.

FIG. 13 illustrates schematic plan views of a normally-on GaN HFET serving as an example of a nitride semiconductor device according to a fifth embodiment of the present invention. Note, however, that FIG. 13(a) illustrates a GaN HFET chip (hereinafter simply referred to as "chip") composed of such GaN HFETs arranged in a matrix. Further, FIG. 13(b) is an enlarged plan view of a GaN HFET located in a central part of the chip. Further, FIG. 13(c) is an enlarged plan view of a GaN HFET located in a peripheral part of the chip.

It should be noted that the GaN HFET according to the fifth embodiment is exactly the same in cross-sectional shape as the GaN HFETs according to the first to third embodiments. Further, the GaN HFET according to the fifth embodiment is exactly the same in planar shape as the GaN HFET according to the fourth embodiment.

Note, however, that the fifth embodiment is configured such that, in a group of GaN HFETs in one column located in the central part of the chip, the gate length Lg(d) of only one GaN HFET located further in the center is longer than the gate length Lg(e) of the GaN HFET located in the peripheral part of the chip. On the other hand, the present embodiment differs in that the gate lengths Lg(d) of all GaN HFETs in one column located in the central part of the chip are longer than the gate length Lg(e) of the GaN HFET located in the peripheral part of the chip.

The present embodiment makes it possible to reduce the saturation current only in a columnar direction of the central part of the chip, which easily rises in temperature at the time of a short circuit, thus making it possible to further reduce generation of heat than in a case where the gate length Lg(d) of only a transistor located in the central part is longer as in the case of the fourth embodiment.

This makes it possible to improve the short-circuit withstand capacity of the element while maintaining the characteristics of the HFET such as reductions in leak current and on resistance, thus making it possible to achieve a nitride semiconductor device with improved reliability.

Sixth Embodiment

Figure 14:
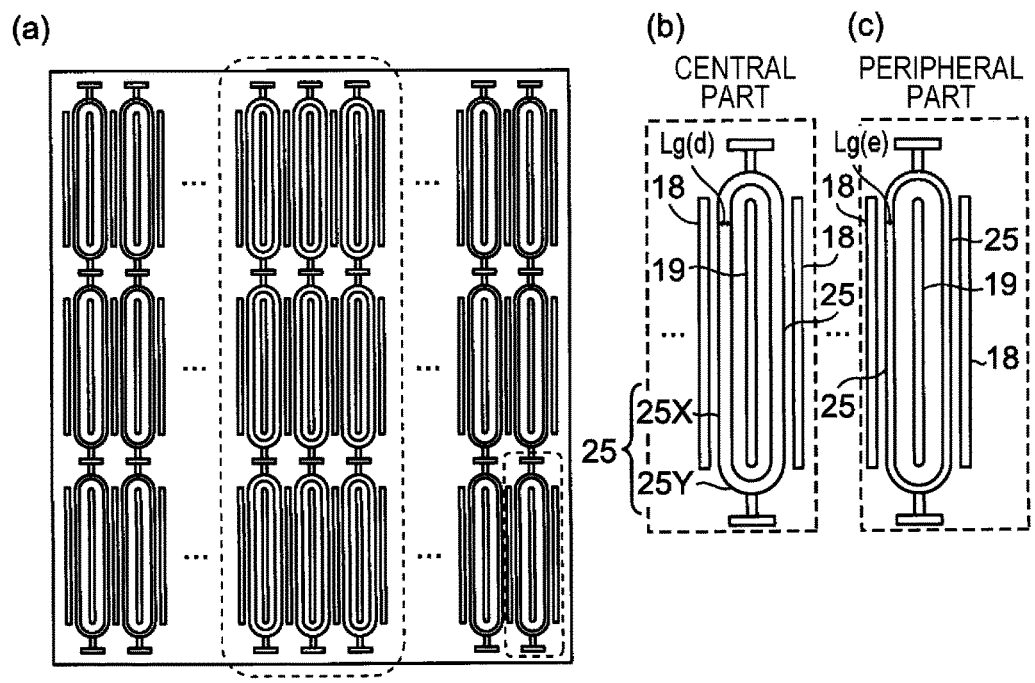
FIG. 14 illustrates plan views of a GaN HFET which is different from those of FIGS. 12 and 13.
Figure 15:
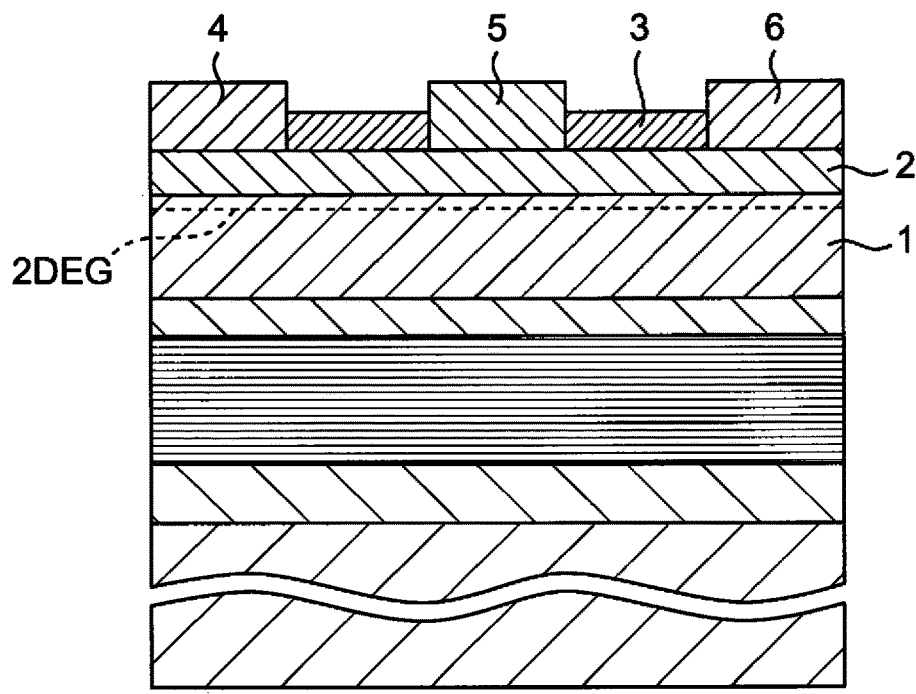
FIG. 15 is a cross-sectional view of a conventional group-III nitride semiconductor field-effect transistor.

FIG. 14 illustrates schematic plan views of a normally-on GaN HFET serving as an example of a nitride semiconductor device according to a sixth embodiment of the present invention. Note, however, that FIG. 14(a) illustrates a GaN HFET chip (hereinafter simply referred to as "chip") composed of such GaN HFETs arranged in a matrix. Further, FIG. 14(b) is an enlarged plan view of a GaN HFET located in a central part of the chip. Further, FIG. 14(c) is an enlarged plan view of a GaN HFET located in a peripheral part of the chip.

It should be noted that the GaN HFET according to the sixth embodiment is exactly the same in cross-sectional shape as the GaN HFETs according to the first to third embodiments. Further, the GaN HFET according to the sixth embodiment is exactly the same in planar shape as the GaN HFETs according to the fourth and fifth embodiments.

Note, however, that the sixth embodiment differs from the fifth embodiment in that the gate lengths Lg(d) of all GaN HFETs in a plurality of columns (in FIG. 14(a), three columns) located in the central part of the chip are longer than the gate length Lg(e) of the GaN HFET located in the peripheral part of the chip.

The sixth embodiment makes it possible to reduce the saturation current in the plurality of columns located in the central part of the chip, which easily rises in temperature at the time of a short circuit, thus making it possible to further reduce generation of heat than in a case where the gate lengths Lg(d) of all transistors in one column located in the central part are longer as in the case of the fifth embodiment.

This makes it possible to improve the short-circuit withstand capacity of the element while maintaining the characteristics of an HFET such as reductions in leak current and on resistance, thus making it possible to achieve a nitride semiconductor device with improved reliability.

It should be noted that the fourth to sixth embodiments take, as examples of semiconductor devices in which a plurality of gate electrodes, drain electrodes, and source electrodes are arranged in a matrix, GaN HFET chips composed of GaN HFETs arranged in a matrix of 3 rows×n columns. However, the number of rows is not particularly limited to 3. In other words, it is needless to say that an increase in gate length of a GaN HFET located in the central part of the chip makes it possible to reduce the saturation current and thus bring about the same effects.

In conclusion, the present invention is characterized as follows:

a nitride semiconductor device of the present invention includes: a nitride semiconductor layer 15 having a heterostructure including at least a channel layer 13 and a barrier layer 14;

a source electrode 18 and a drain electrode 19, placed at a distance from each other, at least parts of which are formed over or within the nitride semiconductor layer 15;

a gate electrode 25 formed between the source electrode 18 and the drain electrode 19 over the nitride semiconductor layer 15 joined to the nitride semiconductor layer 15 via a gate insulating film 24;

a first insulating film 17a, 17b, 20 formed between the source electrode 18 and the gate electrode 25 and between the gate electrode 25 and the drain electrode 19 over the nitride semiconductor layer 15;

a second insulating film 22 covering at least the drain electrode 19 and the source electrode 18; and a thermal stress reducer that reduces thermal stress in a place where thermal stress that is generated between the drain electrode 19 and the second insulating film 22 reaches its maximum at the time of a load short.

In the nitride semiconductor device, the thermal stress reducer is a drain field plate portion 19bf formed by an extension of an upper part of the drain electrode 19 toward the source electrode 18.

For improvement in short-circuit withstand capacity, it is effective to reduce the temperature of a place where thermal stress that is generated between the second insulating film 22 and the drain electrode 19 reaches its maximum, e.g. of the front end of the drain electrode 19, and it is desirable to increase the transient thermal resistance Rth.

The forgoing configuration has, as the thermal stress reducer, the drain field plate portion 19bf formed by an extension of an upper part of the drain electrode 19 toward the source electrode 18. Therefore, the distance from directly below the front end of the drain field plate portion 19bf in the two-dimensional electron gas 16 to the front end of the drain field plate portion 19bf is longer than in the absence of the drain field plate portion 19bf. This makes it possible to increase the transient thermal resistance Rth.

This makes it possible to reduce the temperature of a place where thermal stress that is generated between the second insulating film 22 and the drain electrode 19 reaches its maximum, thus making it possible to reduce the thermal stress that is generated between the second insulating film 22 and the drain electrode 19. This in turn makes it possible to prevent a crack in the second insulating film 22 and elution of the drain electrode 19 into the crack, thus making it possible to improve the short-circuit withstand capacity.

Further, in a nitride semiconductor device according to an embodiment, the drain field plate portion 19bf has a length of 1 μm or longer, and a power density at the time of a load short in the presence of the application of a drain voltage of 400 V is 260 kW/cm$^2$ or lower.

According to this embodiment, the drain field plate portion 19bf having a length of 1 μm or longer is provided, and the power density at the time of a load short in the presence of the application of a drain voltage Vd of 400 V (i.e. the product of the drain current density and the drain voltage Vd at the time of a short circuit) is set at 260 kW/cm$^2$ or lower.

Therefore, as can be seen from FIG. 3, the breakdown time tp at the time of a load short can be set at 2 μsec or longer commonly required of the nitride semiconductor device, so that an effective short-circuit withstand capacity can be attained.

Further, in a nitride semiconductor device according to an embodiment, the drain field plate portion 19bf has a length of 1 μm or longer, and a power density at the time of a load short in the presence of the application of a drain voltage of 400 V is 175 kW/cm$^2$ or lower.

According to this embodiment, the drain field plate portion 19bf having a length of 1 μm or longer is provided, and the power density at the time of a load short in the presence of the application of a drain voltage Vd of 400 V is set at 175 kW/cm$^2$ or lower.

Therefore, as can be seen from FIG. 3, the breakdown time tp at the time of a load short can be set at 5 μsec or longer, which is longer than 2 μsec or longer commonly required of the nitride semiconductor device, so that a further effective short-circuit withstand capacity can be attained.

Further, in a nitride semiconductor device according to an embodiment, the drain field plate portion 19bf has a length of 5 μm or longer, and a power density at the time of a load short in the presence of the application of a drain voltage of 400 V is 360 kW/cm$^2$ or lower.

According to this embodiment, the drain field plate portion 19bf having a length of 5 μm or longer is provided, and the power density at the time of a load short in the presence of the application of a drain voltage Vd of 400 V (i.e. the product of the drain current density and the drain voltage Vd at the time of a short circuit) is set at 360 kW/cm$^2$ or lower.

Therefore, as can be seen from FIG. 3, the breakdown time tp at the time of a load short can be set at 2 μsec or longer commonly required of the nitride semiconductor device, so that an effective short-circuit withstand capacity can be attained.

In that case, in comparison with a case where the drain field plate portion 19bf has a length of, for example, 1 μm or longer and shorter than 5 μm, a breakdown time tp of 2 μsec or longer can be attained even with a higher power density at the time of a load short than in the case of 1 μm or longer and shorter than 5 μm. In other words, the breakdown time tp at the same power density at the time of a load short can be made longer than in the case of 1 μm or longer and shorter than 5 μm, and this is advantageous in terms of improvement in short-circuit withstand capacity.

Note, however, that the shorter the drain field plate portion 19bf is in length, the lower the output capacity can be made. Therefore, the case where the drain field plate portion 19bf has a length of 1 μm or longer and shorter than 5 μm is more advantageous in terms of switching loss reduction than the case where the drain field plate portion 19bf has a length of 5 μm or longer.

Further, in a nitride semiconductor device according to an embodiment, the drain field plate portion 19bf has a length of 5 μm or longer, and a power density at the time of a load short in the presence of the application of a drain voltage of 400 V is 240 kW/cm$^2$ or lower.

According to this embodiment, the drain field plate portion 19bf having a length of 5 μm or longer is provided, and the power density at the time of a load short in the presence of the application of a drain voltage Vd of 400 V is set at 240 kW/cm² or lower.

Therefore, as can be seen from FIG. 3, the breakdown time tp at the time of a load short can be set at 5 µsec or longer, which is longer than 2 µsec or longer commonly required of the nitride semiconductor device, so that a further effective short-circuit withstand capacity can be attained.

In that case, in comparison with a case where the drain field plate portion 19bf has a length of, for example, 1 µm or longer and shorter than 5 µm, a breakdown time tp of 5 µsec or longer can be attained even with a higher power density at the time of a load short than in the case of 1 µm or longer and shorter than 5 µm. In other words, the breakdown time tp at the same power density at the time of a load short can be made longer than in the case of 1 µm or longer and shorter than 5 µm, and this is advantageous in terms of improvement in short-circuit withstand capacity. Note, however, that the case where the drain field plate portion 19bf has a length of 1 µm or longer and shorter than 5 µm is more advantageous in terms of switching loss reduction than the case where the drain field plate portion 19bf has a length of 5 µm or longer.

Further, in a nitride semiconductor device according to an embodiment, the barrier layer 14 has a thickness of 35 nm or thinner, and the gate electrode 25 has a gate length of 5 µm or longer.

According to this embodiment, in a case where the drain field plate portion 19bf having a length of 1 µm or longer is provided and the power density at the time of a load short in the presence of the application of a drain voltage Vd of 400 V (i.e. the product of the drain current density and the drain voltage Vd at the time of a short circuit) is set at 260 kW/cm² or lower so that the breakdown time tp at the time of a load short is 2 µsec or longer, the gate length of the gate electrode 25 can be set at 5 µm or longer by setting the thickness of the barrier layer 14 at 35 nm or thinner.

This makes it possible to achieve a reduction of the saturation current by increasing the gate length, thus making it possible to bring about further improvement in short-circuit withstand capacity.

Further, in a nitride semiconductor device according to an embodiment, the barrier layer 14 has a thickness of 25 nm or thinner, and the gate electrode 25 has a gate length of 8.5 µm or longer.

According to this embodiment, in a case where the drain field plate portion 19bf having a length of 1 µm or longer is provided and the power density at the time of a load short in the presence of the application of a drain voltage Vd of 400 V is set at 175 kW/cm² or lower so that the breakdown time tp at the time of a load short is 5 µsec or longer, the gate length of the gate electrode 25 can be set at 8.5 µm or longer by setting the thickness of the barrier layer 14 at 25 nm or thinner.

This makes it possible to achieve a reduction of the saturation current by increasing the gate length, thus making it possible to bring about further improvement in short-circuit withstand capacity.

In that case, a sufficient breakdown time tp of 5 µsec, which is longer than 2 µsec, can be attained in comparison with the case where the breakdown time tp at the time of a load short is 2 µsec or longer. This eliminates the need to make the thickness of the barrier layer 14 an unnecessary thickness of thicker than 25 nm.

Further, in a nitride semiconductor device according to an embodiment, the barrier layer 14 has a thickness of 35 nm or thinner, and the gate electrode 25 has a gate length of 2 µm or longer.

According to this embodiment, in a case where the drain field plate portion 19bf having a length of 5 µm or longer is provided and the power density at the time of a load short in the presence of the application of a drain voltage Vd of 400 V (i.e. the product of the drain current density and the drain voltage Vd at the time of a short circuit) is set at 360 kW/cm² or lower so that the breakdown time tp at the time of a load short is 2 µsec or longer, the gate length of the gate electrode 25 can be set at 2 µm or longer by setting the thickness of the barrier layer 14 at 35 nm or thinner.

This makes it possible to achieve a reduction of the saturation current by increasing the gate length, thus making it possible to bring about further improvement in short-circuit withstand capacity.

Further, in a nitride semiconductor device according to an embodiment, the barrier layer 14 has a thickness of 25 nm or thinner, and the gate electrode 25 has a gate length of 5 µm or longer.

According to this embodiment, in a case where the drain field plate portion 19bf having a length of 5 µm or longer is provided and the power density at the time of a load short in the presence of the application of a drain voltage Vd of 400 V is set at 240 kW/cm² or lower so that the breakdown time tp at the time of a load short is 5 µsec or longer, the gate length of the gate electrode 25 can be set at 5 µm or longer by setting the thickness of the barrier layer 14 at 25 nm or thinner.

This makes it possible to achieve a reduction of the saturation current by increasing the gate length, thus making it possible to bring about further improvement in short-circuit withstand capacity.

In that case, a sufficient breakdown time tp of 5 µsec, which is longer than 2 µsec, can be attained in comparison with the case where the breakdown time tp at the time of a load short is 2 µsec or longer. This eliminates the need to make the thickness of the barrier layer 14 an unnecessary thickness of thicker than 25 nm.

Further, in a nitride semiconductor device according to an embodiment, the nitride semiconductor layer 15 is constituted by the channel layer 13 and the barrier layer 14 and formed directly on a substrate 11.

According to this embodiment, the nitride semiconductor layer 15 can be structured not to include the superlattice layer 12. Therefore, the heat generated in the two-dimensional electron gas 16 directly below the front end of the drain electrode 19 does not need to be conducted toward the substrate 11 via the superlattice layer 12, which is poor in thermal conductivity. This allows the heat to be dissipated toward the substrate 11 and upward through the drain electrode 19, thus making it possible to prevent a breakdown from occurring due to the generation of heat.

Further, in a nitride semiconductor device according to an embodiment, the drain field plate portion 19bf has a length of 1 µm or longer, and a power density at the time of a load short in the presence of the application of a drain voltage of 400 V is 330 kW/cm² or lower.

According to this embodiment, the drain field plate portion 19bf having a length of 1 µm or longer is provided, and the power density at the time of a load short in the presence of the application of a drain voltage Vd of 400 V (i.e. the product of the drain current density and the drain voltage Vd at the time of a short circuit) is set at 330 kW/cm² or lower.

Therefore, as can be seen from FIG. 11, by structuring the nitride semiconductor layer 15 not to include the superlattice layer 12, a breakdown time tp of 2 µsec or longer can be attained even with a higher power density at the time of a load short than in the case of a structure including the superlattice layer 12. That is, further improvement in short-circuit withstand capacity can be brought about than in the case of a structure in which the nitride semiconductor layer 15 includes the superlattice layer 12.

Further, in a nitride semiconductor device according to an embodiment, the drain field plate portion 19bf has a length of 1 μm or longer, and a power density at the time of a load short is 220 kW/cm² or lower.

According to this embodiment, the drain field plate portion 19bf having a length of 1 μm or longer is provided, and the power density at the time of a load short in the presence of the application of a drain voltage Vd of 400 V is set at 220 kW/cm² or lower.

Therefore, as can be seen from FIG. 11, by structuring the nitride semiconductor layer 15 not to include the superlattice layer 12, a breakdown time tp of 5 μsec or longer can be attained even with a higher power density at the time of a load short than in the case of a structure including the superlattice layer 12. That is, further improvement in short-circuit withstand capacity can be brought about than in the case of a structure in which the nitride semiconductor layer 15 includes the superlattice layer 12.

Further, in a nitride semiconductor device according to an embodiment, the drain field plate portion 19bf has a length of 5 μm or longer, and a power density at the time of a load short is 450 kW/cm² or lower.

According to this embodiment, the drain field plate portion 19bf having a length of 5 μm or longer is provided, and the power density at the time of a load short in the presence of the application of a drain voltage Vd of 400 V is set at 450 kW/cm² or lower.

Therefore, as can be seen from FIG. 11, by structuring the nitride semiconductor layer 15 not to include the superlattice layer 12, a breakdown time tp of 2 μsec or longer cam be attained even with a higher power density at the time of a load short than in the case of a structure including the superlattice layer 12. That is, further improvement in short-circuit withstand capacity can be brought about than in the case of a structure in which the nitride semiconductor layer 15 includes the superlattice layer 12.

Further, in a nitride semiconductor device according to an embodiment, the drain field plate portion 19bf has a length of 5 μm or longer, and a power density at the time of a load short is 300 kW/cm² or lower.

According to this embodiment, the drain field plate portion 19bf having a length of 5 μm or longer is provided, and the power density at the time of a load short in the presence of the application of a drain voltage Vd of 400 V is set at 300 kW/cm² or lower.

Therefore, as can be seen from FIG. 11, by structuring the nitride semiconductor layer 15 not to include the superlattice layer 12, a breakdown time tp of 5 μsec or longer can be attained even with a higher power density at the time of a load short than in the case of a structure including the superlattice layer 12. That is, further improvement in short-circuit withstand capacity can be brought about than in the case of a structure in which the nitride semiconductor layer 15 includes the superlattice layer 12.

Further, in a nitride semiconductor device according to an embodiment, the drain electrode 19 comprises a plurality of drain electrodes 19 formed in finger shapes parallel to each other over the nitride semiconductor layer 15 in a plan view, the source electrode 18 comprises a plurality of source electrodes 18 formed in finger shapes parallel to each other over the nitride semiconductor layer 15 and arranged alternately with the drain electrodes 19 in an arrangement direction of the drain electrodes 19, the gate electrode 25 comprises a plurality of finger-shaped gate electrodes 25 each formed over the nitride semiconductor layer 15 and between that one of the drain electrodes 19 and that one of the source electrodes 18 which are disposed adjacent to each other, the plurality of drain electrodes 19, the plurality of source electrodes 18, and the plurality of gate electrodes 25 are formed on the same chip, and a gate length Lg(d) of that one of the gate electrodes 25 which is located in a central part of the chip is longer than a gate length Lg(e) of that one of the gate electrodes 25 which is located in a peripheral part of the chip.

According to this embodiment, a nitride semiconductor device chip obtained by densely forming a plurality of finger-shaped source electrodes 18, a plurality of finger-shaped drain electrodes 19, and a plurality of finger-shaped gate electrodes 25 on the same chip is configured such that a gate length Lg(d) of that one of the gate electrodes 25 which is located in a central part of the chip is longer than a gate length Lg(e) of that one of the gate electrodes 25 which is located in a peripheral part of the chip.

This makes it possible to minimize an increase in on resistance per unit area and reduce the saturation current in the central part of the chip, which easily rises in temperature at the time of a short circuit. This makes it possible to reduce generation of heat, thus making it possible to improve the short-circuit withstand capacity of the element.

REFERENCE SIGNS LIST

11 Si substrate
12 Buffer layer (superlattice layer)
13 Undoped GaN layer (channel layer)
14 Undoped AlGaN layer (barrier layer)
15 Nitride semiconductor layer
16 Two-dimensional electron gas
17a First insulating film
17b Second insulating film
18 Source electrode
18a Source ohmic electrode
18b Source metal wire
18bf Source field plate portion
19 Drain electrode
19a Drain ohmic electrode
19b Drain metal wire
19bf Drain field plate portion
20 Third insulating film
21, 23 Interlayer insulating film
22 Passivation film
24 Gate insulating film
25 Gate electrode
25a Base portion
25b Gate field plate portion

The invention claimed is:
1. A nitride semiconductor device comprising:
a nitride semiconductor layer having a heterostructure including at least a channel layer and a barrier layer;
a source electrode and a drain electrode, placed at a distance from each other, at least parts of which are formed over or within the nitride semiconductor layer;

a gate electrode formed between the source electrode and the drain electrode over the nitride semiconductor layer;

a first insulating film formed between the source electrode and the gate electrode and between the gate electrode and the drain electrode over the nitride semiconductor layer;

a second insulating film covering at least the drain electrode; and a thermal stress reducer that reduces thermal stress in a place where thermal stress that is generated between the drain electrode and the second insulating film reaches its maximum at the time of a load short, wherein the thermal stress reducer is a drain field plate portion formed by an extension of an upper part of the drain electrode toward the source electrode, the drain field plate portion has a length that falls within a range of 1 μm to 5 μm, and a power density is set on the basis of a correlation line on which a short-circuit withstand capacity is proportional to the negative square of the power density.

2. The nitride semiconductor device according to claim 1, wherein the drain field plate portion has a length of 1 μm or longer, and
a power density at the time of a load short in the presence of the application of a drain voltage of 400 V is 260 kW/cm² or lower.

3. The nitride semiconductor device according to claim 1, wherein the drain field plate portion has a length of 1 μm or longer, and
a power density at the time of a load short in the presence of the application of a drain voltage of 400 V is 175 kW/cm² or lower.

4. The nitride semiconductor device according to claim 1, wherein the drain field plate portion has a length of 5 μm or longer, and
a power density at the time of a load short in the presence of the application of a drain voltage of 400 V is 360 kW/cm² or lower.

5. The nitride semiconductor device according to claim 1, wherein the drain field plate portion has a length of 5 μm or longer, and
a power density at the time of a load short in the presence of the application of a drain voltage of 400 V is 240 kW/cm² or lower.

6. The nitride semiconductor device according to claim 2, wherein the barrier layer has a thickness of 35 nm or thinner, and
the gate electrode has a gate length of 5 μm or longer.

7. The nitride semiconductor device according to claim 1, wherein the nitride semiconductor layer is constituted by the channel layer and the barrier layer and formed directly on a substrate,
the drain field plate portion has a length of 1 μm or longer, and
a power density at the time of a load short in the presence of the application of a drain voltage of 400 V is 330 kW/cm² or lower.

8. The nitride semiconductor device according to claim 1, wherein the nitride semiconductor layer is constituted by the channel layer and the barrier layer and formed directly on a substrate,
the drain field plate portion has a length of 1 μm or longer, and
a power density at the time of a load short in the presence of the application of a drain voltage of 400 V is 220 kW/cm² or lower.

9. The nitride semiconductor device according to claim 1, wherein the nitride semiconductor layer is constituted by the channel layer and the barrier layer and formed directly on a substrate,
the drain field plate portion has a length of 5 μm or longer, and
a power density at the time of a load short in the presence of the application of a drain voltage of 400 V is 450 kW/cm² or lower.

10. The nitride semiconductor device according to claim 1, wherein the nitride semiconductor layer is constituted by the channel layer and the barrier layer and formed directly on a substrate,
the drain field plate portion has a length of 5 μm or longer, and
a power density at the time of a load short in the presence of the application of a drain voltage of 400 V is 300 kW/cm² or lower.

11. The nitride semiconductor device according to claim 1, wherein the drain electrode comprises a plurality of drain electrodes formed in finger shapes parallel to each other over the nitride semiconductor layer in a plan view,
the source electrode comprises a plurality of source electrodes formed in finger shapes parallel to each other over the nitride semiconductor layer and arranged alternately with the drain electrodes in an arrangement direction of the drain electrodes,
the gate electrode comprises a plurality of finger-shaped gate electrodes each formed over the nitride semiconductor layer and between that one of the drain electrodes and that one of the source electrodes which are disposed adjacent to each other,
the plurality of drain electrodes, the plurality of source electrodes, and the plurality of gate electrodes are formed on the same chip, and
a gate length of that one of the gate electrodes which is located in a central part of the chip is longer than a gate length of that one of the gate electrodes which is located in a peripheral part of the chip.

12. The nitride semiconductor device according to claim 1, wherein the correlation line is expressed by the following formula:

$$tp=(\Delta Tc/M)^2 \times ((Id/S) \times Vd)^{-2}$$

where tp is the breakdown time (short-circuit withstand capacity) of an element, ΔTc is the rise in critical temperature when the element breaks down at the time of a short circuit (constant), M is the constant of proportionality, Id/S is the drain current density, Vd is the drain voltage, and (Id/S)×Vd is the average power density.

13. A nitride semiconductor device comprising:
a nitride semiconductor layer having a heterostructure including at least a channel layer and a barrier layer,
a source electrode and a drain electrode, placed at a distance from each other, at least parts of which are formed over or within the nitride semiconductor layer;
a gate electrode formed between the source electrode and the drain electrode over the nitride semiconductor layer; a first insulating film formed between the source electrode and the gate electrode and between the gate electrode and the drain electrode over the nitride semiconductor layer;
a second insulating film covering at least the drain electrode; and
a thermal stress reducer that reduces thermal stress in a place where thermal stress that is generated between the drain electrode and the second insulating film reaches its maximum at the time of a load short, wherein the thermal stress reducer is a drain field plate portion formed by an extension of an upper part of the drain electrode toward the source electrode, the drain field plate portion has a length that falls within a range of 1 µm to 5 µm, and a power density is set on the basis of a correlation line on which a short-circuit withstand capacity is proportional to the negative square of the power density, and a single correlation line is determined with respect to a single length of the drain field plate portion.

14. A nitride semiconductor device comprising:

a nitride semiconductor layer having a heterostructure including at least a channel layer and a barrier layer, a source electrode and a drain electrode, placed at a distance from each other, at least parts of which are formed over or within the nitride semiconductor layer;

a gate electrode formed between the source electrode and the drain electrode over the nitride semiconductor layer, a first insulating film formed between the source electrode and the gate electrode and between the gate electrode and the drain electrode over the nitride semiconductor layer;

a second insulating film covering at least the drain electrode; and a thermal stress reducer that reduces thermal stress in a place where thermal stress that is generated between the drain electrode and the second insulating film reaches its maximum at the time of a load short, wherein the thermal stress reducer is a drain field plate portion formed by an extension of an upper part of the drain electrode toward the source electrode over the first insulating film located between the gate electrode and the drain electrode, the drain field plate portion has a front end located between a lower part of the drain electrode and the gate electrode in a direction crossing a lamination direction of the nitride semiconductor layer, and the drain field plate portion has a length that falls within a range of 1 µm to 5 µm.

* * * * *